(12) United States Patent
Otsuki et al.

(10) Patent No.: US 10,340,440 B2
(45) Date of Patent: Jul. 2, 2019

(54) ELECTRONIC DEVICE, METHOD FOR PRODUCING ELECTRONIC DEVICE, ELECTRONIC APPARATUS, AND MOVING OBJECT

(71) Applicant: Seiko Epson Corporation, Tokyo (JP)

(72) Inventors: Tetsuya Otsuki, Fujimi (JP); Shiro Murakami, Shiojiri (JP); Tomohiro Arai, Tatsuno (JP); Mitsuhiro Wada, Matsumoto (JP); Hiroshi Ito, Suwa (JP); Manabu Shiraki, Ina (JP); Manabu Kondo, Matsumoto (JP); Muneyoshi Hama, Suwa (JP)

(73) Assignee: Seiko Epson Corporation (JP)

( * ) Notice: Subject to any disclaimer, the term of this patent is extended or adjusted under 35 U.S.C. 154(b) by 448 days.

(21) Appl. No.: 15/086,620

(22) Filed: Mar. 31, 2016

(65) Prior Publication Data

US 2016/0293827 A1 Oct. 6, 2016

(30) Foreign Application Priority Data

Apr. 3, 2015 (JP) ................................. 2015-076942
Dec. 18, 2015 (JP) ................................. 2015-247799

(51) Int. Cl.
*H03H 9/02* (2006.01)
*H01L 41/29* (2013.01)
(Continued)

(52) U.S. Cl.
CPC ...... *H01L 41/0477* (2013.01); *C23C 14/0036* (2013.01); *C23C 14/025* (2013.01);
(Continued)

(58) Field of Classification Search
CPC .................................................. H01L 41/0477
(Continued)

(56) References Cited

U.S. PATENT DOCUMENTS

2011/0043078 A1 2/2011 Tsuda
2011/0260585 A1 10/2011 Ichikawa et al.
(Continued)

FOREIGN PATENT DOCUMENTS

JP 2001-230648 A 8/2001
JP 2005-136801 A 5/2005
(Continued)

OTHER PUBLICATIONS

JP 2014-203839 corresponds to U.S. Pub. No. 2016-0027996.
(Continued)

*Primary Examiner* — Thomas M Dougherty
*Assistant Examiner* — Karen B Addison
(74) *Attorney, Agent, or Firm* — Harness, Dickey & Pierce, P.L.C.

(57) ABSTRACT

An electronic device includes a base material, a first metal film disposed on the base material and containing nitrogen and chromium, and a second metal film disposed on the first metal film and containing gold. In the first metal film, the number of nitrogen atoms may be between 20% to 100% of the number of chromium atoms. Further, the distribution of nitrogen atoms in the first metal film is larger in a third region sandwiched between a first region on the base material side of the first metal film and a second region on the second metal film side than in the first region and in the second region.

16 Claims, 30 Drawing Sheets

(51) Int. Cl.
*H01L 41/047* (2006.01)
*H01L 41/08* (2006.01)
*C23C 14/18* (2006.01)
*H03H 9/215* (2006.01)
*H03H 9/05* (2006.01)
*C23C 14/00* (2006.01)
*C23C 14/02* (2006.01)
*C23C 14/06* (2006.01)
*H03H 9/13* (2006.01)
*H03H 9/17* (2006.01)

(52) U.S. Cl.
CPC ........ *C23C 14/0641* (2013.01); *C23C 14/185* (2013.01); *H01L 41/29* (2013.01); *H03H 9/02023* (2013.01); *H03H 9/0509* (2013.01); *H03H 9/0514* (2013.01); *H03H 9/0519* (2013.01); *H03H 9/0547* (2013.01); *H03H 9/131* (2013.01); *H03H 9/171* (2013.01); *H03H 9/215* (2013.01)

(58) Field of Classification Search
USPC .................. 310/363–366, 328, 358; 257/738
See application file for complete search history.

(56) References Cited

U.S. PATENT DOCUMENTS

| 2013/0214650 A1 | 8/2013 | Mizusawa |
| 2013/0241357 A1 | 9/2013 | Hayasaka et al. |
| 2014/0139073 A1 | 5/2014 | Ariji et al. |
| 2014/0361665 A1* | 12/2014 | Hayasaka ............ H03H 9/1021 310/348 |
| 2016/0027996 A1 | 1/2016 | Fujii et al. |

FOREIGN PATENT DOCUMENTS

| JP | 2007-013384 A | 1/2007 |
| JP | 2010-183539 A | 8/2010 |
| JP | 2011-147098 A | 7/2011 |
| JP | 2011-250390 A | 12/2011 |
| JP | 2012-039667 | 2/2012 |
| JP | 2013-172368 A | 9/2013 |
| JP | 2013-192119 A | 9/2013 |
| JP | 2013-243452 A | 12/2013 |
| JP | 2014-103505 A | 6/2014 |
| JP | 2014-200041 A | 10/2014 |
| JP | 2014-200042 A | 10/2014 |
| JP | 2014-203839 | 10/2014 |
| JP | 2014-239358 A | 12/2014 |

OTHER PUBLICATIONS

JP 2011-147098 corresponds to U.S. Pub. No. 2011-0043078.
JP 2013-172368 corresponds to U.S. Pub. No. 2013-0214650.
JP 2014-239358 corresponds to U.S. Pub. No. 2014-0361665.
JP 2014-103505 corresponds to U.S. Pub. No. 2014-0139073.
JP 2013-192119 corresponds to U.S. Pub. No. 2013-0241357; and.
JP 2011-250390 corresponds to U.S. Pub. No. 2011-0260585.

* cited by examiner

ELECTRONIC DEVICE, METHOD FOR PRODUCING ELECTRONIC DEVICE, ELECTRONIC APPARATUS, AND MOVING OBJECT

BACKGROUND

1. Technical Field

The present disclosure relates to an electronic device, a method for producing an electronic device, an electronic apparatus, and a moving object.

2. Related Art

Various types of electronic devices may include an electrode that has a configuration in which a Cr (chromium) layer and an Au (gold) layer are laminated. However, in such a configuration, due to heat or the like received during production, Cr in the Cr layer diffuses into the Au layer and decreases the bonding strength (adhesiveness) between the Cr layer and the Au layer, and thus, the Au layer is easily peeled off. In order to solve such a problem, JP-A-2013-243452 (PTL 1) discloses an electrode having a configuration in which a Ni (nickel) layer is disposed between a Cr layer and an Au layer. Further, JP-A-2013-172368 (PTL 2) discloses an electrode having a configuration in which a Ni—W (nickel-tungsten) layer is disposed between a Cr layer and an Au layer. Further, JP-A-2007-013384 (PTL 3) discloses a configuration in which a CrN (chromium nitride) layer is formed by subjecting the surface of a Cr layer to a nitrogen plasma treatment, and an Au layer is disposed thereon.

However, according to PTL 1 and PTL 2, an additional layer that prevents the diffusion of Cr is required to be formed between the Cr layer and the Au layer, and therefore, the configuration of the electrode and the steps for forming the electrode are complicated. On the other hand, according to PTL 3, it is difficult to control the nitrogen plasma treatment, and the bonding strength between the CrN layer and the Au layer may be decreased depending on the distribution of N in the CrN layer.

SUMMARY

An advantage of some aspects of the present disclosure is to provide an electronic device which has a metal film structure having a high bonding strength and capable of being relatively easily produced, and a method for producing an electronic device, an electronic apparatus, and a moving object.

The present disclosure can be implemented as the following forms or application examples.

An electronic device according to an application example includes a base material having a first surface, a first metal film disposed on the first surface and containing nitrogen and chromium, and a second metal film disposed on a surface of the first metal film on the opposite side to the first surface and containing gold. The first metal film includes a region in which the number of nitrogen atoms in the first metal film is 20% or more and 100% or less of the number of chromium atoms (i.e., between 20% to 100% of the number of chromium atoms).

According to this configuration, the bonding strength between the first metal film and the second metal film can be increased. Further, according to this configuration, an electronic device can be relatively easily produced.

In the above application example, the first metal film may include a region in which the number of nitrogen atoms in the first metal film is 20% or more and 50% or less of the number of chromium atoms (i.e., between 20% to 50% of the number of chromium atoms).

According to this configuration, the bonding strength between the base material and a metal film structure composed of the first metal film and the second metal film can be further increased.

In the above application example, the first metal film may include a region in which the number of nitrogen atoms in the first metal film is 40% or more and 100% or less of the number of chromium atoms (i.e., between 40% to 100% of the number of chromium atoms).

According to this configuration, for example, the bonding strength between the second metal film and a bonding wire can be further increased.

In the above application example, the first metal film may include a region in which the number of nitrogen atoms in the first metal film is 40% or more and 50% or less of the number of chromium atoms (i.e., between 40% to 50% of the number of chromium atoms).

According to this configuration, the bonding strength between the base material and a metal film structure composed of the first metal film and the second metal film can be further increased, and also the bonding strength between the second metal film and a bonding wire can be further increased.

An electronic device according to an application example includes a base material having a first surface, a first metal film disposed on the first surface and containing nitrogen and chromium, and a second metal film disposed on a surface of the first metal film on the opposite side to the first surface and containing gold. The first metal film includes a first region located on the base material side, a second region located on the second metal film side, and a third region sandwiched between the first region and the second region. The third region includes a region in which the distribution of nitrogen atoms is larger than in the first region and in the second region.

According to this configuration, the bonding strength between the first metal film and the second metal film can be increased. Further, according to this configuration, an electronic device can be relatively easily produced.

In the above application example, the first metal film may include a region in which the number of nitrogen atoms in the first metal film is 20% or more and 100% or less of the number of chromium atoms (i.e., between 20% to 100% of the number of chromium atoms).

According to this configuration, the bonding strength between the first metal film and the second metal film can be further increased.

In the above application example, the first metal film may include a region in which the number of nitrogen atoms in the first metal film is 20% or more and 50% or less of the number of chromium atoms (i.e., between 20% to 50% of the number of chromium atoms).

According to this configuration, the bonding strength between the base material and a metal film structure composed of the first metal film and the second metal film can be further increased.

In the above application example, the first metal film may include a region in which the number of nitrogen atoms in the first metal film is 40% or more and 100% or less of the number of chromium atoms (i.e., between 50% to 100% of the number of chromium atoms).

According to this configuration, for example, the bonding strength between the second metal film and a bonding wire can be further increased.

In the above application example, the first metal film may include a region in which the number of nitrogen atoms in the first metal film is 40% or more and 50% or less of the number of chromium atoms (i.e., between 40% to 50% of the number of chromium atoms).

According to this configuration, the bonding strength between the base material and a metal film structure composed of the first metal film and the second metal film can be further increased, and also the bonding strength between the second metal film and a bonding wire can be further increased.

In the above application example, the base material may contain at least one of quartz crystal, glass, and silicon.

According to this configuration, for example, the electronic device can be applied to a vibrator element, an electronic component-mounting substrate, or the like, and the convenience is improved.

In the above application example, the device includes a piezoelectric substrate, an excitation electrode disposed on the piezoelectric substrate, and a connection electrode disposed on the piezoelectric substrate and electrically connected to the excitation electrode. The base material is the piezoelectric substrate, and at least one of the excitation electrode and the connection electrode includes the first metal film and the second metal film.

According to this configuration, a vibrator element having excellent characteristics is obtained.

A method for producing an electronic device according to an application example includes: preparing a base material; forming a first metal film containing nitrogen and chromium on the base material by sputtering in a nitrogen-containing atmosphere (a first film forming step); and forming a second metal film containing gold on the first metal film by sputtering (a second film forming step).

According to this configuration, the bonding strength between the first metal film and the second metal film can be increased, and an electronic device having a metal film structure having a high mechanical strength can be easily produced.

In the above application example, in the first film forming step, a film is formed so as to include a region in which the number of nitrogen atoms in the first metal film is 20% or more and 100% or less of the number of chromium atoms (i.e., between 20% to 100% of the number of chromium atoms).

According to this configuration, the bonding strength between the base material and a metal film structure composed of the first metal film and the second metal film can be further increased.

In the above application example, in the first film forming, a film is formed so as to include regions such that the distribution of nitrogen atoms in the first metal film is larger in a third region sandwiched between a first region on the base material side of the first metal film and a second region on the second metal film side than in the first region and in the second region.

According to this configuration, the bonding strength between the first metal film and the second metal film can be further increased.

An electronic apparatus according to an application example includes the electronic device according to the above application example.

According to this configuration, an electronic apparatus having high reliability is obtained.

A moving object according to an application example includes the electronic device according to the above application example.

According to this configuration, a moving object having high reliability is obtained.

BRIEF DESCRIPTION OF THE DRAWINGS

The present disclosure will be described with reference to the accompanying drawings, wherein like numbers reference like elements.

DESCRIPTION OF EXEMPLARY EMBODIMENTS

Hereinafter, an electronic device, a method for producing an electronic device, an electronic apparatus, and a moving object according to the present disclosure will be described in detail with reference to embodiments shown in the accompanying drawings.

First Embodiment

Figure 1:
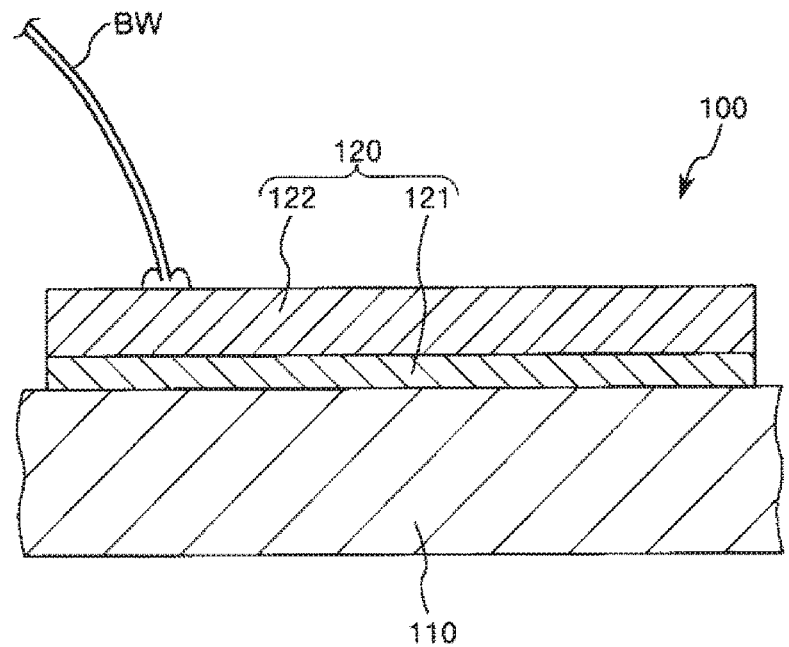
FIG. 1 is a cross-sectional view of an electronic device according to a first embodiment of the present disclosure.
Figure 2:
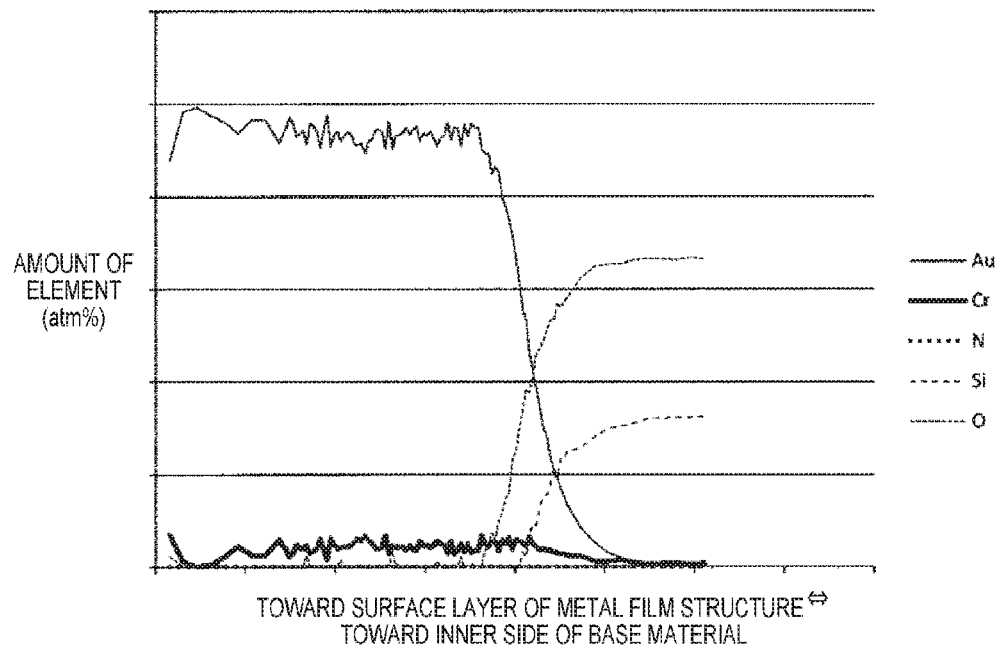
FIG. 2 is a graph showing the distribution of elements in an electronic device having a related art configuration.
Figure 3:
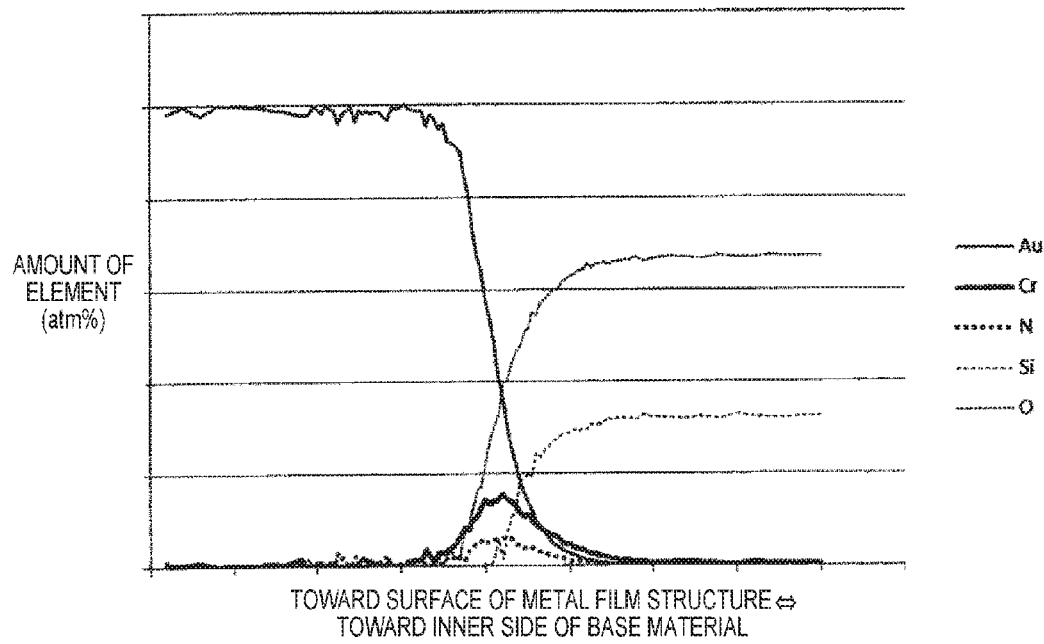
FIG. 3 is a graph showing the distribution of elements in the electronic device shown in FIG. 1.
Figure 4:
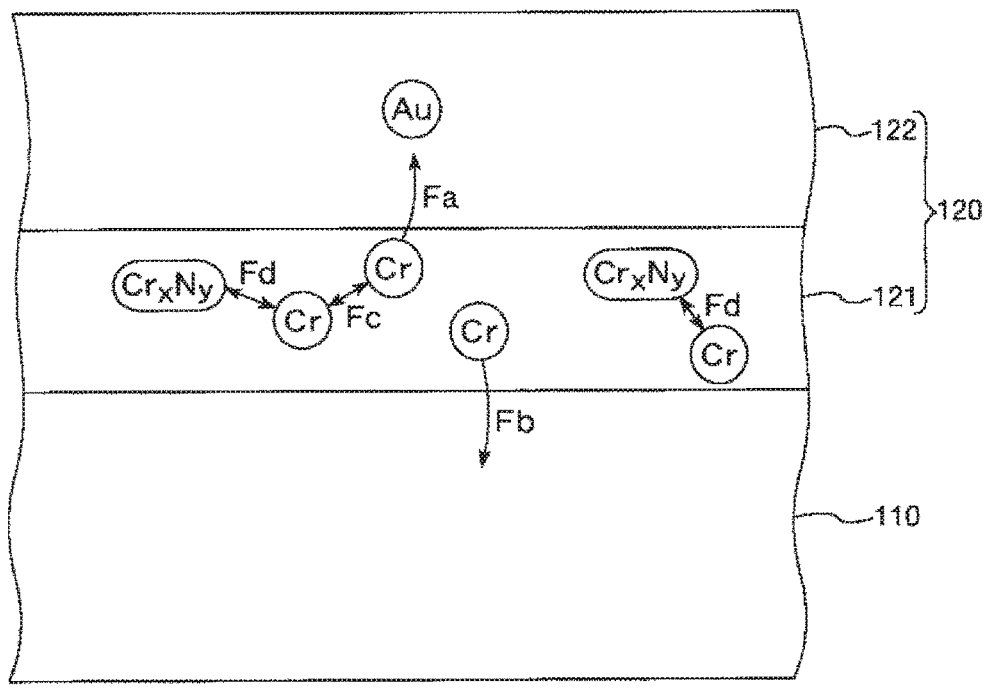
FIG. 4 is a conceptual view showing the principle of how to reduce the diffusion of Cr (chromium) atoms.
Figure 5:
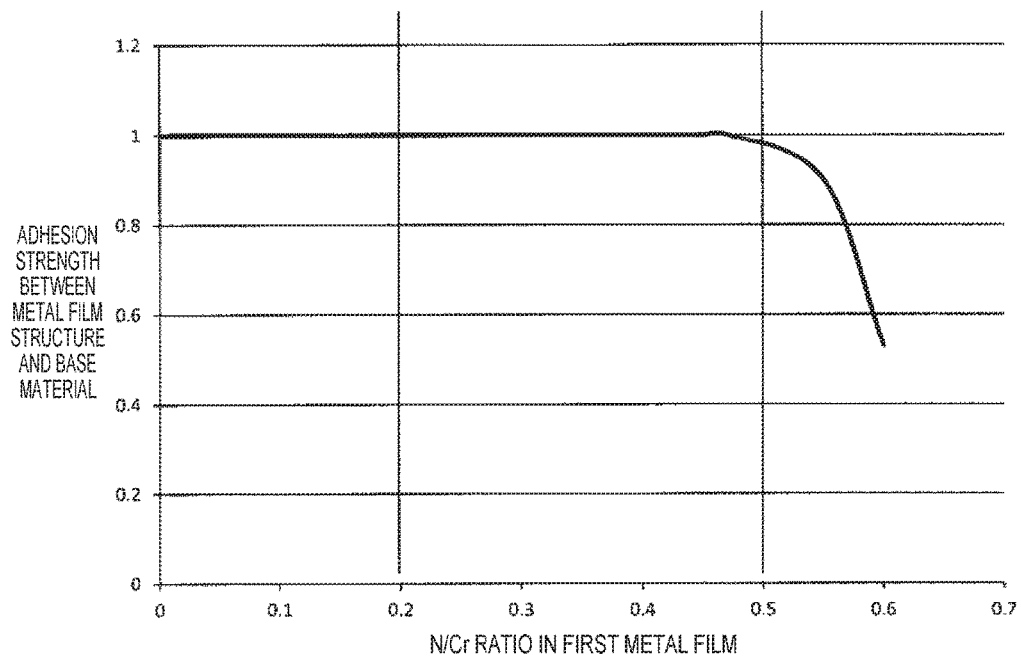
FIG. 5 is a graph showing an adhesion strength between a metal film structure and a base material.
Figure 6:
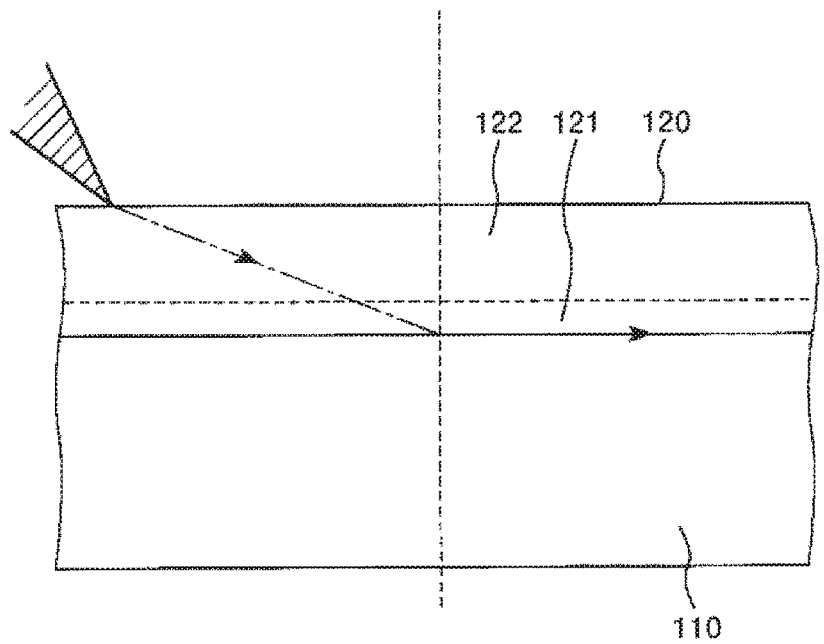
FIG. 6 is a view for explaining the SAICAS method.
Figure 7:
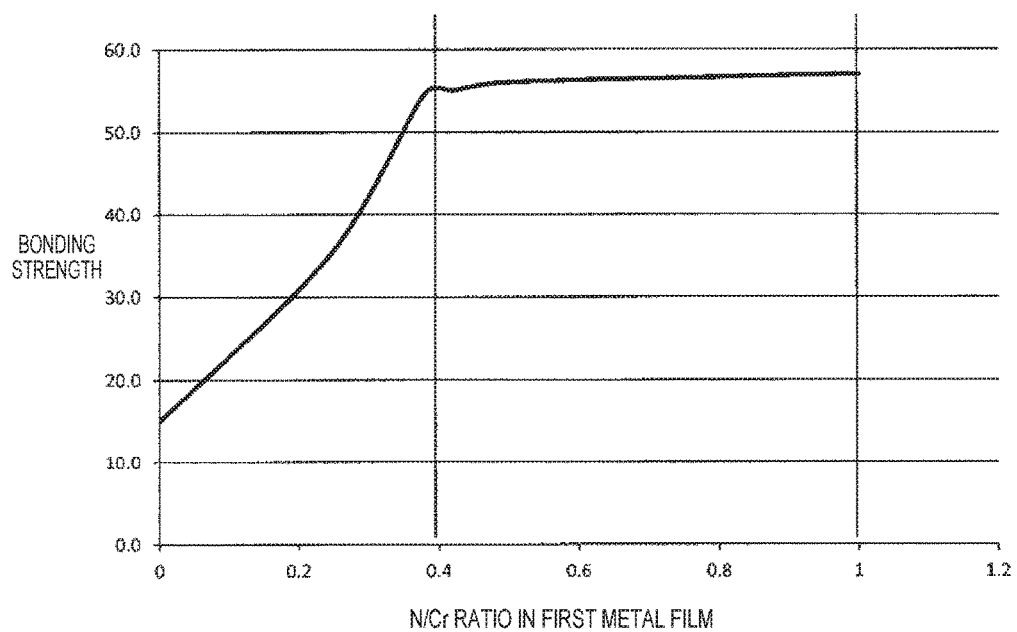
FIG. 7 is a graph showing a bonding strength between a second metal film and a bonding wire.
Figure 8:
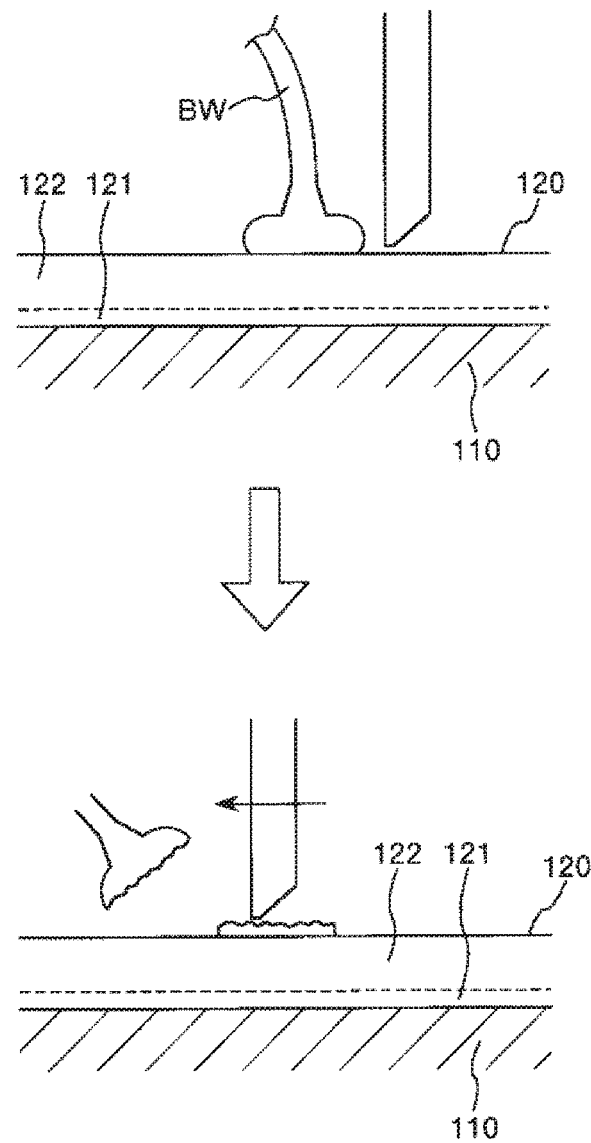
FIG. 8 is a view for explaining a shear test.
Figure 9:
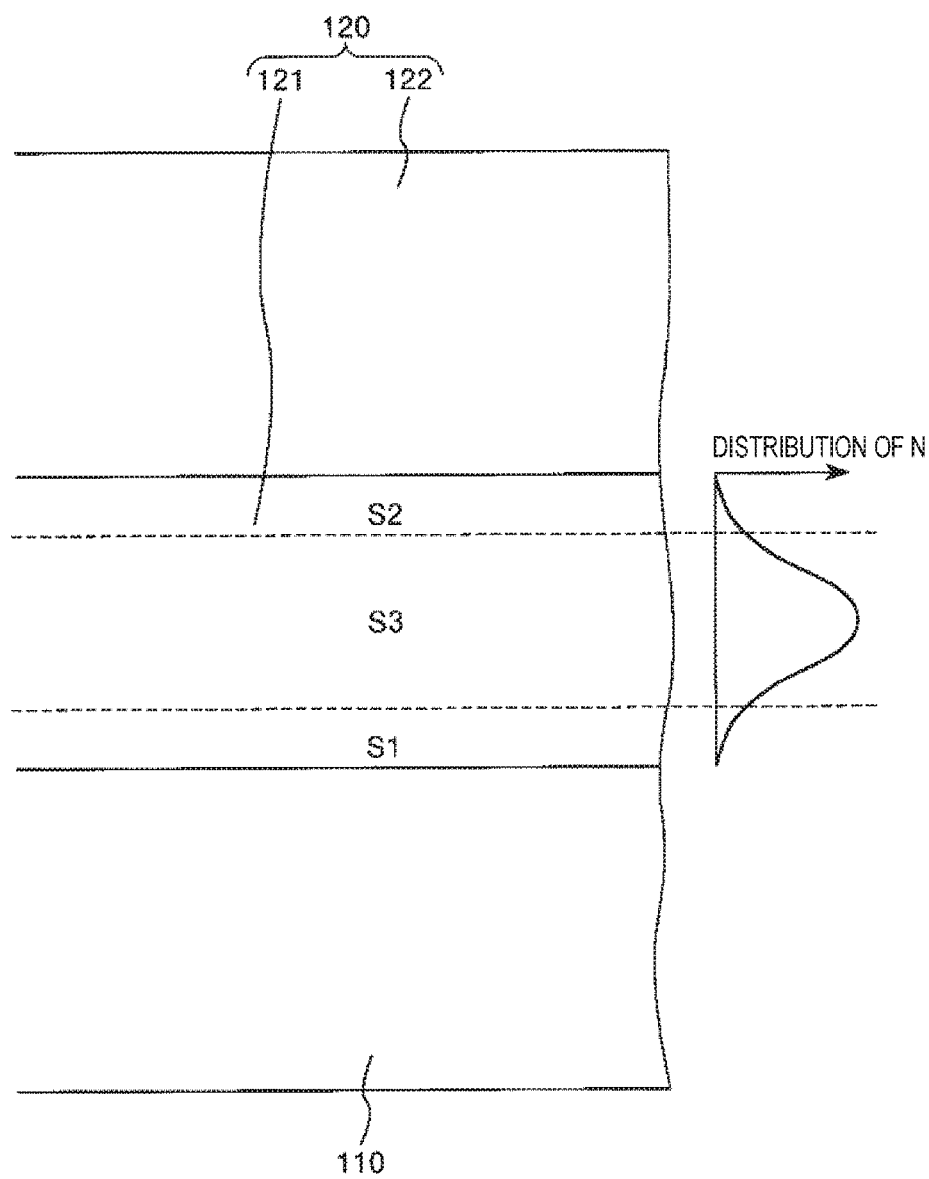
FIG. 9 is a view showing the distribution of N (nitrogen) atoms in a first metal film.

FIG. 1 is a cross-sectional view of an electronic device according to a first embodiment of the present disclosure. FIG. 2 is a graph showing the distribution of elements in an electronic device having a related art configuration. FIG. 3 is a graph showing the distribution of elements in the electronic device shown in FIG. 1. FIG. 4 is a conceptual view showing the principle of how to reduce the diffusion of Cr (chromium) atoms. FIG. 5 is a graph showing an adhesion strength between a metal film structure and a base material. FIG. 6 is a view for explaining the SAICAS method. FIG. 7 is a graph showing a bonding strength between a second metal film and a bonding wire. FIG. 8 is a view for explaining a shear test. FIG. 9 is a view showing the distribution of N (nitrogen) atoms in a first metal film. FIGS. 10 to 13 are cross-sectional views each for explaining a method for producing the electronic device shown in FIG. 1. In the following description, for the sake of convenience of explanation, an upper side in FIG. 1 is referred to as "upper," and a lower side in FIG. 1 is referred to as "lower."

As shown in FIG. 1, an electronic device 100 includes a base material 110 and a metal film structure 120 disposed on the base material 110 in at least a portion thereof. The base material 110 is not particularly limited and may be, for example, a vibrating substrate as described in the below-mentioned second and third embodiments, or an electronic component-mounting substrate as described in the below-mentioned fourth embodiment. Further, a constituent material of the base material 110 is not particularly limited. For example, a variety of glass materials, a variety of resin materials, a variety of metal materials, a variety of ceramic materials, and a variety of piezoelectric materials can be used. The use of the metal film structure 120 is not particularly limited. For example, in the case where the base material 110 is a vibrating substrate, the metal film structure 120 can be used as an excitation electrode that excites the vibrating substrate, and in the case where the base material 110 constitutes an electronic component-mounting substrate, the metal film structure 120 can be used as a terminal or a bonding layer. That is, the metal film structure 120 can be applied to a wide range of applications whether it is used for transmission of an electrical signal or not.

Next, the metal film structure 120 will be described in detail. The metal film structure 120 has a two-layer laminated structure including a first metal film 121 disposed on the upper surface (first surface) of the base material 110 and a second metal film 122 disposed on the upper surface of the first metal film 121 (a surface on the opposite side to the base material 110). The first metal film 121 may increase the adhesiveness between the base material 110 and the second metal film 122, and the second metal film 122 may make the entire metal film structure 120 an electrical conductor, that is, a conductive film for conducting electricity, or a function to increase the bonding strength to another member.

The second metal film 122 is constituted by Au (gold). According to this, the second metal film 122 has excellent electrical conductivity and bonding properties. As will also be described in the below-mentioned production method, this second metal film 122 is formed by depositing Au by sputtering. According to such a method, the second metal film 122 can be easily formed. The second metal film 122 may also contain, in addition to Au, another metal element, a non-metal element (e.g., Si (silicon), O (oxygen), or the like), or the like. The average thickness of the second metal film 122 is not particularly limited, but is preferably, for example, about 10 nm or more and 1000 nm or less, or more preferably, about 100 nm or more and 300 nm or less, or further more preferably, about 110 nm or more and 120 nm or less.

The first metal film 121 is constituted by Cr (chromium) and N (nitrogen). As will also be described in the below-mentioned production method, this first metal film 121 is formed by depositing Cr by sputtering in a N-containing gas atmosphere. According to such a method, the first metal film 121 can be easily formed. Further, the number of N atoms ($N_N$) in the first metal film 121 is 20% (atm %) or more and 100% or less of the number of Cr atoms ($N_{Cr}$). That is, $N_N/N_{Cr}$ is 20% or more and 100% or less. The first metal film 121 may also contain, in addition to Cr and N, another metal element or non-metal element (e.g., Si (silicon), O (oxygen), or the like). The average thickness of the first metal film 121 is not particularly limited, but is preferably, for example, about 2 nm or more and 300 nm or less, more preferably about 2 nm or more and 5 nm or less. According to this, while sufficiently exhibiting the function to increase the adhesiveness between the base material 110 and the second metal film 122, the first metal film 121 can be made as thin as possible.

In FIG. 2, a diffusion state of Cr in an Au/Cr laminated metal film in the case where a metal film corresponding to the first metal film 121 is constituted by Cr and also a metal film corresponding to the second metal film 122 is constituted by Au is shown as a related art example. In FIG. 3, a diffusion state of Cr in the metal film structure 120 of this embodiment is shown. The data shown in FIGS. 2 and 3 are results of an analysis obtained by using a quartz crystal substrate as the base material 110, forming the first metal film 121 or a metal film corresponding to the first metal film 121, and the second metal film 122 or a metal film corresponding to the second metal film 122 by sputtering, followed by performing a heating treatment under conditions of 260° C. for 2 hours. The analysis was performed by X-ray photoelectron spectroscopy (XPS) using "Quantera II" (apparatus name) manufactured by Ulvac-Phi, Inc.

The analyzer is not limited to the above-mentioned analyzer, and the same analysis can be performed also when another analyzer employing X-ray photoelectron spectroscopy is used, or a qualitative and quantitative analysis method such as secondary ion mass spectrometry, an electron probe micro-analysis method, Auger electron spectroscopy, or an X-ray fluorescence analysis method is used. Further, the number of N atoms ($N_N$) and the number of Cr atoms ($N_{Cr}$) in the first metal film 121 may be determined using a result obtained by measurement at one place in the first metal film 121. Alternatively, the number of N atoms and Cr atoms may be determined using an average of results obtained by measurement at a plurality of places such as, for example, at 2 places to 10 places in a direction intersecting a direction in which the first metal film 121 and the second metal film 122 overlap with each other (i.e., in a plane of the first metal film 121). Further, in the case where measurement is performed at a plurality of places, the respective measurement places may be arranged linearly or planarly at substantially equal intervals between the adjacent places. The size of a measurement region (i.e., a measurement region or a measurement area in one place) for determining the number of N atoms ($N_N$) and the number of Cr atoms ($N_{Cr}$) in the first metal film 121 is not particularly limited, and may be within a range which can be set when the above-mentioned analyzer is used.

As apparent from the comparison of FIG. 2 with FIG. 3, it is found that by adopting the configuration of this embodiment, as compared with the case where the metal film corresponding to the first metal film 121 is constituted by Cr (i.e., a case where substantially no N is contained in the metal film corresponding to the first metal film 121), the first metal film 121 is stabilized, and Cr in the first metal film 121 does not diffuse into the second metal film 122. With reference to FIG. 4, in the first metal film 121, $Cr_xN_y$ (x and y are each an integer of 1 or more) and Cr are present. In FIG. 4, Fa represents a force for Cr to diffuse into the second metal film 122, Fb represents a force for Cr to diffuse into the base material 110, Fc represents a force for Cr atoms to attract each other, and Fd represents a force for $Cr_xN_y$ and Cr to attract each other. To prevent Cr in the first metal film 121 from diffusing into the second metal film 122, the following relationship is established: Fb≥Fd≥Fa≥Fc.

Due to this, as compared with the related art example, the possibility that Cr in the first metal film 121 diffuses into the second metal film 122 is reduced. Therefore, the decrease in the adhesiveness between the first metal film 121 and the second metal film 122 can be reduced, and thus, the peel-off of the second metal film 122 can be reduced. In addition, the possibility that Cr in the first metal film 121 diffuses into the base material 110 is reduced, and therefore, the decrease in the adhesiveness between the base material 110 and the first metal film 121 (i.e., the adhesiveness between the entire metal film structure 120 and the base material 110) can be reduced. FIG. 5 is a graph showing a result obtained by measuring an adhesion strength between the base material 110 and the metal film structure 120 using the SAICAS method. The SAICAS method is a measurement method in which as shown in FIG. 6, the metal film structure 120 is continuously cut with a sharp cutting edge starting from the surface thereof, a shear strength is determined from the cutting force in the metal film structure 120, and then, an adhesion strength is determined from the force during interfacial cutting. Here, this measurement was performed using "SAICAS-NN" (apparatus name) manufactured by Daipla Wintes Co., Ltd. Incidentally, the apparatus for measuring the adhesion strength between the base material 110 and the metal film structure 120 is not limited to the above-mentioned apparatus, and the same measurement can be performed also when using another apparatus employing the same measurement method. It is found that the adhesiveness between the base material 110 and the metal film structure 120 is high when $N_N/N_{Cr}$ is within the range of 20% or more and 50% or less as shown in FIG. 5. Hereinafter, such an effect is also referred to as "first effect."

Further, as compared with the related art example, the possibility that Cr in the first metal film 121 diffuses into the second metal film 122 is reduced, and the number of Cr atoms in the second metal film 122 is reduced, and therefore, the deposition of Cr on the surface of the second metal film 122 is reduced. Thus, the possibility that a Cr oxide film which is formed by oxidation of Cr is formed on the surface of the second metal film 122 is reduced. The Cr oxide film has poor adhesiveness to a metal as compared with a Cr film or an Au film, and therefore, as the Cr oxide film is formed less on the surface of the second metal film 122, the bonding strength to another metal, for example, a metal structure such as a bonding wire or a metal film is improved. Due to this, the second metal film 122 and a bonding wire BW can be connected to each other with a high bonding strength. FIG. 7 is a graph showing a result obtained by measuring a bonding strength between the second metal film 122 and the bonding wire BW by a shear test. The shear test is a method in which a bonded portion is pushed with a tool as shown in FIG. 8 and a load at breakage is measured. It is found that the bonding strength between the second metal film 122 and the bonding wire BW is high when $N_N/N_{Cr}$ is within the range of 20% or more and 100% or less, preferably within the range of 40% or more and 100% or less as shown in FIG. 7. Hereinafter, such an effect is also referred to as "second effect."

In this manner, the first effect is particularly exhibited when $N_N/N_{Cr}$ is within the range of 20% or more and 50% or less, and the second effect is particularly exhibited when $N_N/N_{Cr}$ is within the range of 40% or more and 100% or less. Therefore, $N_N/N_{Cr}$ is particularly preferably within the range of 40% or more and 50% or less. According to this, while maintaining the adhesiveness between the first metal film 121 and the second metal film 122 at a high level, the first effect and the second effect can be simultaneously exhibited.

When $N_N/N_{Cr}$ is less than 20%, Cr in the first metal film 121 diffuses into the second metal film 122 at the time of application of heat, and thus, the adhesiveness between the first metal film 121 and the second metal film 122 is decreased. Further, Cr is deposited on the surface of the second metal film 122, so that a Cr oxide film which is formed by oxidation of Cr is easily formed on the surface of the second metal film 122, and thus, the connection strength to the bonding wire BW is decreased. On the other hand, when $N_N/N_{Cr}$ is larger than 100%, the adhesiveness between the first metal film 121 and the base material 110 is decreased, and thus, the possibility that the metal film structure 120 is peeled off from the base material 110 is increased.

Further, as found from FIGS. 3 and 9, the distribution of N atoms in the first metal film 121 is larger in a third region S3 (central portion) sandwiched between a first region S1 on the base material 110 side of the first metal film 121 and a second region S2 on the second metal film 122 side than in the first region S1 and in the second region S2. More specifically, the amount of distribution of N atoms gradually increases from the first and second regions S1 and S2 toward the third region S3. When having such a distribution, the number of $Cr_xN_y$ in the first and second regions S1 and S2 can be prevented from becoming excessive, and thus, the decrease in the adhesiveness of the first metal film 121 to the second metal film 122 and also to the base material 110 can be suppressed. Further, since the number of $Cr_xN_y$ in the first metal film 121 can be further increased while exhibiting such an effect, the diffusion of Cr can be more effectively reduced. Due to this, the metal film structure 120 has a higher bonding strength, and also the bonding wire BW can be connected to the metal film structure 120 with a higher bonding strength. Incidentally, even when the first metal film 121 does not include the above-mentioned first region, second region, and third region throughout the region in the first metal film 121, at least part of the above-mentioned effect can be obtained as long as a region having the above-mentioned first region, second region, and third region is included in the first metal film 121.

Hereinabove, the electronic device 100 has been described. Incidentally, in this embodiment, the first metal film 121 is disposed on the upper surface of the base material 110. In another embodiment, another film or a member may be interposed between the base material 110 and the first metal film 121. In addition, on the surface of the second metal film 122 on the opposite side to the surface in contact with the first metal film 121, a metal film may be further laminated.

In addition, although not particularly limited, the upper surface of the first metal film 121 (i.e., the interface between the first metal film 121 and the second metal film 122) can be defined as, for example, a surface which is set such that 95% of the total Cr atoms are contained in the first metal film 121.

Further, a region in the vertical direction of the first metal film 121, or more particularly, the range of the first metal film 121 can also be defined by using a point at which the number of Cr atoms reaches the maximum as a reference, and a range in which 95% of the total Cr atoms are contained is defined as the upper surface and the lower surface of the first metal film 121.

Further, in the first embodiment, nitrogen (N) and chromium (Cr) are contained in the first metal film 121; however, it is not limited thereto, and in place of Cr, titanium (Ti), nickel (Ni), tungsten (W), nickel-tungsten (Ni—W), or the like may be contained. Further, in this embodiment, gold (Au) is contained in the second metal film 122; however, it is not limited thereto, and in place of Au, silver (Ag), copper (Cu), platinum (Pt), aluminum (Al), or the like may be contained. Further, even when the first metal film 121 does not satisfy the above-mentioned range of $N_N/N_{Cr}$ throughout the region of the first metal film 121, at least part of the above-mentioned effect can be obtained as long as a region that satisfies the above-mentioned range of $N_N/N_{Cr}$ is included in the first metal film 121.

Figure 10:
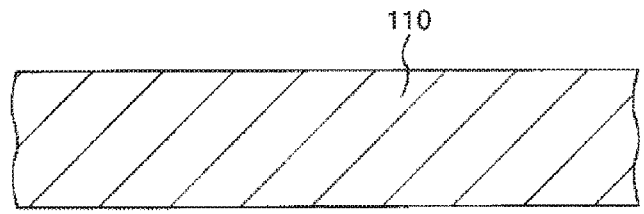
FIG. 10 is a cross-sectional view for explaining a method for producing the electronic device shown in FIG. 1.
Figure 11:
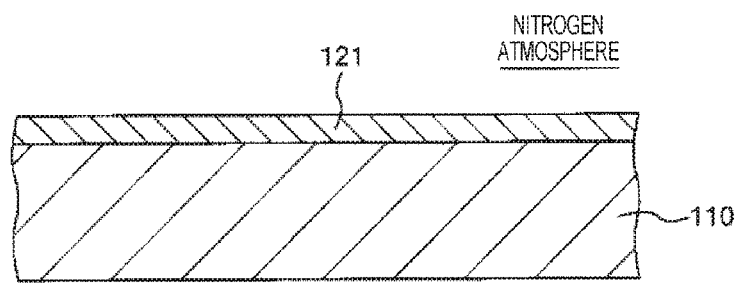
FIG. 11 is a cross-sectional view for explaining a method for producing the electronic device shown in FIG. 1.
Figure 12:
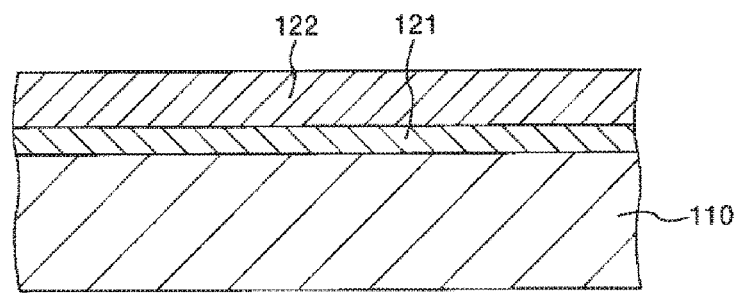
FIG. 12 is a cross-sectional view for explaining a method for producing the electronic device shown in FIG. 1.
Figure 13:
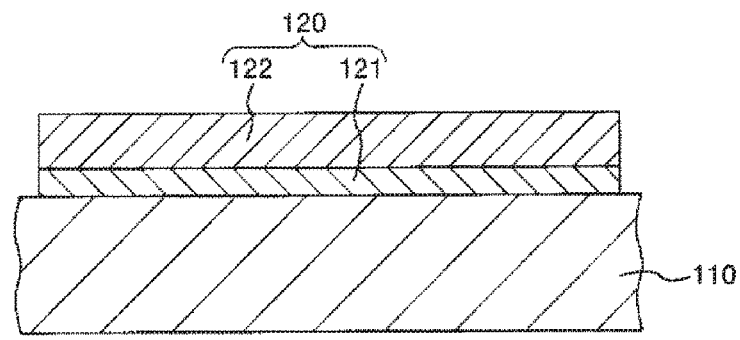
FIG. 13 is a cross-sectional view for explaining a method for producing the electronic device shown in FIG. 1.

Next, a method for producing the electronic device 100 will be described. The method for producing the electronic device 100 includes a preparation step of preparing the base material 110 as shown in FIG. 10, a first film forming step of forming the first metal film 121 on the base material 110 by sputtering Cr in a N (nitrogen)-containing gas atmosphere as shown in FIG. 11, a second film forming step of forming the second metal film 122 on the first metal film 121 by sputtering Au as shown in FIG. 12, and a patterning step of patterning the first and second metal films 121 and 122 using a photolithography technique and an etching technique as shown in FIG. 13. The N-containing gas may contain, for example, in addition to nitrogen (N), a rare gas such as argon (Ar), helium (He), neon (Ne), krypton (Kr), or xenon (Xe).

Further, in the first film forming step, by controlling the amount (concentration) of N in the atmosphere, as described above, the number of N atoms in the first metal film 121 is set to 20% or more and 100% or less of the number of Cr atoms. In addition, the distribution of N atoms in the first metal film 121 can be made larger in the third region S3 than in the first region S1 and in the second region S2. According to this, the above-mentioned first metal film 121 can be formed, and thus, the above-mentioned effect can be exhibited.

According to such a production method, the metal film structure 120 can be formed without increasing the steps as compared with the related art. Further, the first metal film 121 can be stabilized before forming the second metal film 122, and therefore, after forming the second metal film 122, the diffusion of Cr in the first metal film 121 into the second metal film 122 can be effectively reduced. In addition, according to such a production method, it is also possible to continuously perform the first film forming step and the second film forming step. That is, in the film forming steps, the first film forming step and the second film forming step can also be performed continuously without taking out the base material 110 from a chamber for forming the metal films (film forming chamber), and therefore, it is also possible to easily produce the electronic device 100.

Second Embodiment

Figure 14:
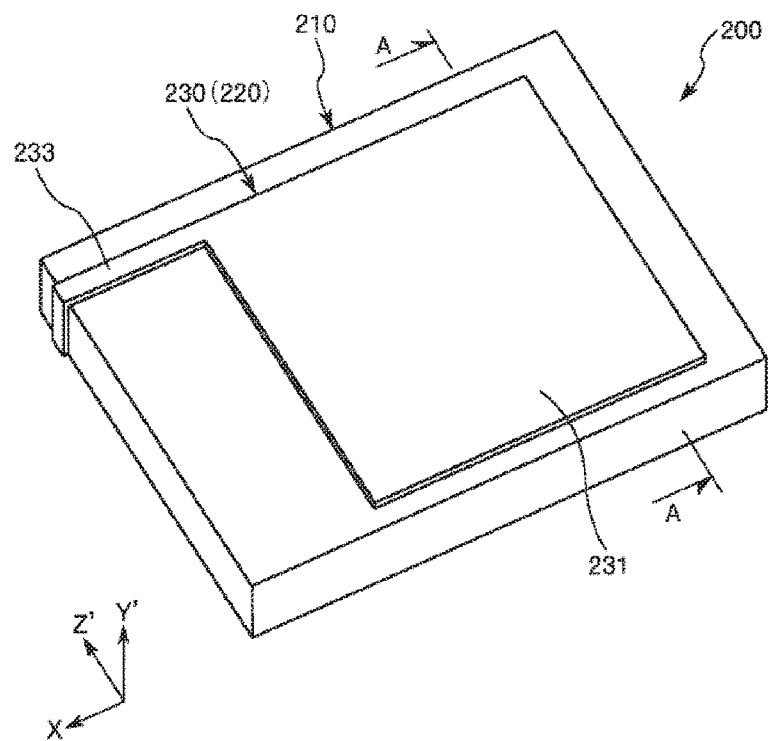
FIG. 14 is a perspective view of a vibrator element as an electronic device according to a second embodiment of the present disclosure seen from an upper side.
Figure 15:
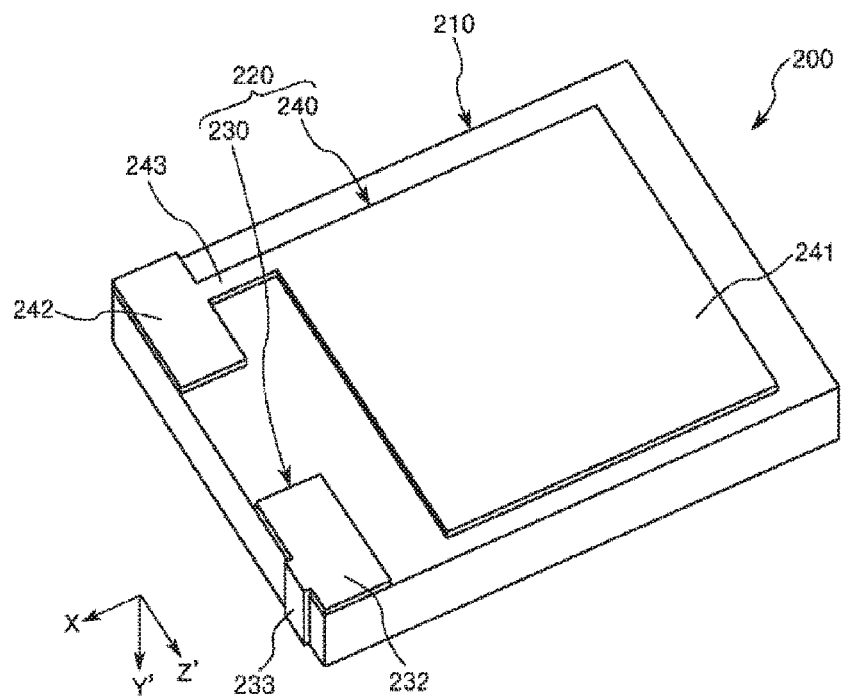
FIG. 15 is a perspective view of the vibrator element shown in FIG. 14 seen from a lower side.
Figure 16:
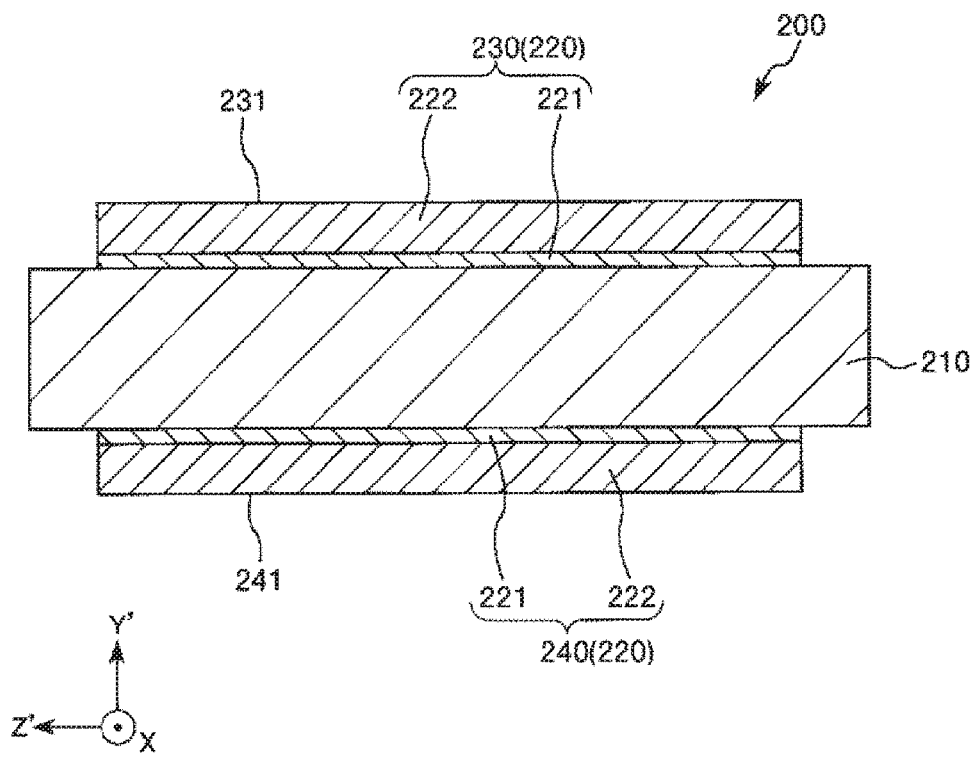
FIG. 16 is a cross-sectional view taken along the line A-A in FIG. 14.
Figure 17:
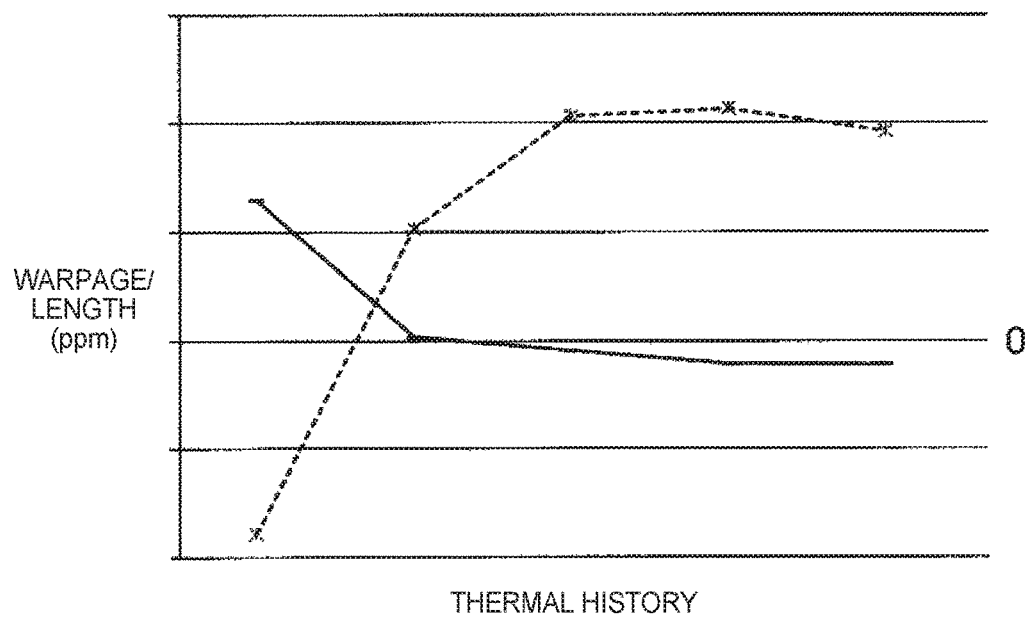
FIG. 17 is a graph showing the deflection of a quartz crystal substrate after a heating treatment.
Figure 18:
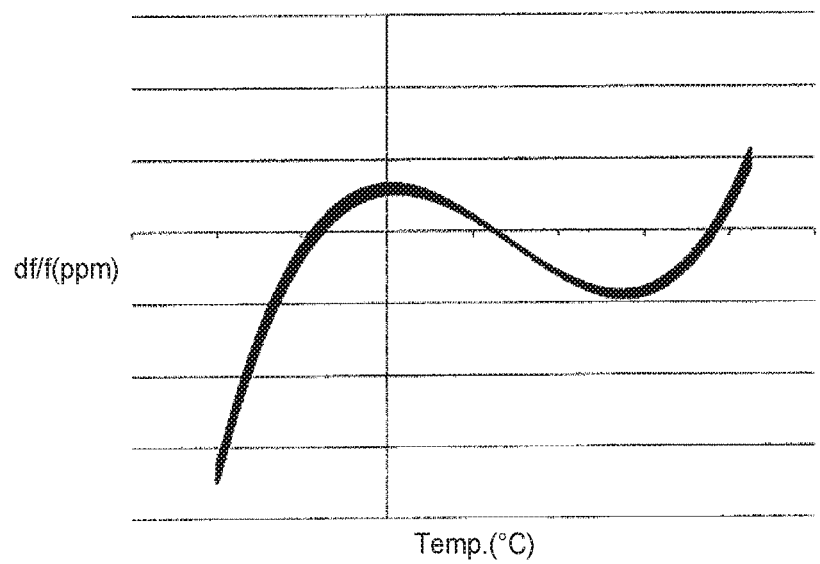
FIG. 18 is a graph showing a variation in the frequency-temperature characteristics of the vibrator element shown in FIG. 14.
Figure 19:
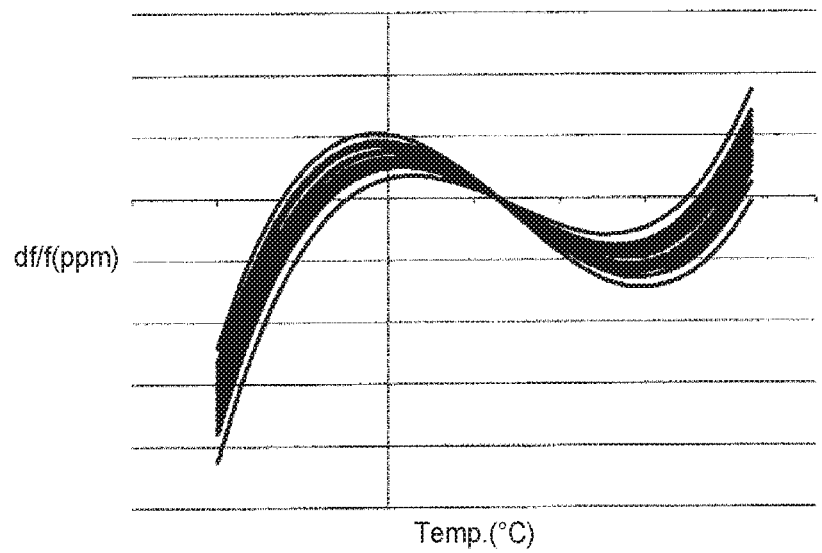
FIG. 19 is a graph showing a variation in the frequency-temperature characteristics of a related art vibrator element.

FIG. 14 is a perspective view of a vibrator element as the electronic device according to a second embodiment of the present disclosure seen from an upper side. FIG. 15 is a perspective view of the vibrator element shown in FIG. 14 seen from a lower side. FIG. 16 is a cross-sectional view taken along the line A-A in FIG. 14. FIG. 17 is a graph showing the deflection of a quartz crystal substrate after a heating treatment. FIG. 18 is a graph showing a variation in the frequency-temperature characteristics of the vibrator element shown in FIG. 14. FIG. 19 is a graph showing a variation in the frequency-temperature characteristics of a related art vibrator element.

Hereinafter, with respect to the electronic device (vibrator element) of the second embodiment, different points from the above-mentioned embodiment will be mainly described, and the description of the same matter will be omitted.

As shown in FIGS. 14 and 15, a vibrator element 200, which is the electronic device, includes a quartz crystal substrate (piezoelectric substrate) 210 and an electrode 220 formed on the quartz crystal substrate 210. In such a vibrator element 200, the quartz crystal substrate 210 corresponds to the base material 110 of the above-mentioned first embodiment, and the electrode 220 corresponds to the metal film structure 120.

The quartz crystal substrate 210 performs thickness shear vibration. When the crystal axes of a quartz crystal are defined as an X axis (electrical axis), a Y axis (mechanical axis), and a Z axis (optical axis), the quartz crystal substrate 210 is a "rotated Y-cut quartz crystal substrate" cut out along a plane obtained by rotating the XZ plane by a predetermined angle θ about the X axis, and is an "AT-cut quartz crystal substrate" cut out along a plane obtained by particularly rotating the XZ plane only by an angle θ of 35° 15' degrees in this embodiment. By using such a quartz crystal substrate 210, the vibrator element 200 has excellent temperature characteristics. However, the quartz crystal substrate 210 is not limited to the AT-cut quartz crystal substrate. For example, as long as it can excite thickness shear vibration, a BT-cut or an SC-cut quartz crystal substrate may also be used. In addition, hereinafter, the Y axis and the Z axis rotated about the X axis in accordance with the angle θ are defined as a Y' axis and a Z' axis.

The quartz crystal substrate 210 is in a plate shape having a thickness in the Y'-axis direction and expanding in the XZ'-plane direction. Further, the quartz crystal substrate 210 has a rectangular shape with a long side in the X-axis direction and a short side in the Z'-axis direction when seen in a plan view. However, the shape of the quartz crystal substrate 210 when seen in a plan view is not particularly limited, and for example, may be a square shape with sides having substantially the same lengths in the X-axis direction and the Z'-axis direction, and may be a rectangular shape with a short side in the X-axis direction and a long side in the Z'-axis direction. In addition, the shape of the quartz crystal substrate 210 is not limited to the plate shape, and may be a bi-mesa shape in which a vibrating region protrudes from both principal surfaces in the thickness direction, or may be a plano-mesa shape in which a vibrating region protrudes from only one principal surface in the thickness direction, or may be an inverted-mesa shape in which a vibrating region is recessed, or may be subjected to a beveling process in which the periphery of the substrate is ground, a bi-convex process in which the upper surface and the lower surface are processed into convex curved surfaces, or a plano-convex process in which only one surface is processed into a convex curved surface. Incidentally, in a bi-mesa shape or a plano-mesa shape, the protruding shape of the vibrating region may be a single-stepped mesa shape in which only one portion protrudes or may be a multi-stepped mesa shape in which two or more portions protrude.

The electrode 220 includes a first electrode 230 and a second electrode 240. Further, the first electrode 230 includes an excitation electrode 231, a connection electrode 232, and a wiring electrode 233. Similarly, the second electrode 240 includes an excitation electrode 241, a connection electrode 242, and a wiring electrode 243.

The excitation electrode 231 is disposed on the upper surface (a principal surface on the +Y'-axis side) of the quartz crystal substrate 210, and the excitation electrode 241 is disposed on the lower surface (a principal surface on the −Y'-axis side) of the quartz crystal substrate 210 so as to face the excitation electrode 231. That is, the excitation electrode 231 and the excitation electrode 241 are disposed so as to overlap each other when seen in a plan view with the quartz crystal substrate 210 sandwiched therebetween. Then, a region of the quartz crystal substrate 210 sandwiched by the excitation electrodes 231 and 241 of the quartz crystal substrate 210 becomes a vibrating region in which thickness shear vibration is excited. Further, the connection electrodes 232 and 242 are disposed in parallel to the Y'-axis direction in an end portion on the +X-axis side of the lower surface of the quartz crystal substrate 210. Then, the wiring electrode 233 is disposed so as to connect the excitation electrode 231 and the connection electrode 232, and the wiring electrode 243 is disposed so as to connect the excitation electrode 241 and the connection electrode 242.

As shown in FIG. 16, the first and second electrodes 230 and 240 have a two-layer laminated structure including a first metal film 221 disposed in contact with a surface of the quartz crystal substrate 210 and a second metal film 222 formed (laminated) in contact with a surface of the first metal film 221 on the opposite side to the surface in contact with the quartz crystal substrate 210. The first metal film 221 has the same configuration as that of the first metal film 121 of the above-mentioned first embodiment, and the second metal film 222 has the same configuration as that of the second metal film 122 of the above-mentioned first embodiment. Therefore, the diffusion of Cr into the second metal film 222 is reduced, and thus, the same effect as that of the above-mentioned first embodiment can be exhibited.

Further, as a particular effect derived from this embodiment, the diffusion of Cr atoms in the first metal film 221 into the second metal film 222 is reduced. Therefore, the increase in the resistance value of the second metal film 222 is suppressed, and thus, the vibrator element 200 has a low CI value.

In addition, by the same effect as that of the first embodiment, the possibility that a Cr oxide film is formed on the surface of the second metal film 222 is reduced, and therefore, the change in the mass over time of the first and second electrodes 230 and 240 may be suppressed. Specifically, the increase in the mass due to bonding of an oxygen (O) atom to Cr deposited on the surface of the second metal film 222 (oxidation) or the like can be suppressed to be small (e.g., can be suppressed to substantially 0), and also the deflection of the quartz crystal substrate 210 due to stress generated by a Cr oxide film can be reduced. According to this, the vibrator element 200 is configured such that the change in the resonance frequency over time (e.g., the fluctuation in the resonance frequency of the vibrator element 200 over time, the fluctuation in the frequency-temperature characteristics of the vibrator element 200 over time, etc.) in the vibrator element 200 is small, the variation in the frequency-temperature characteristics among a plurality of vibrator elements 200 is small, and so on.

FIG. 17 is a graph obtained by subjecting each of the vibrator element 200 and a related art vibrator element to a heating treatment a plurality of times. The related art vibrator element is a vibrator element in which a metal film corresponding to the first metal film 221 is constituted by Cr and a metal film corresponding to the second metal film 222 is constituted by Au. FIG. 17 evaluates the deflection of the vibrator element after the heating treatment. The deflection may be a value which is obtained by subtracting the minimum height from the maximum height in the Y'-axis direction along the X axis, or in other words, is the amount of warpage in the X-axis direction of the vibrator element. The result of the vibrator element 200 is represented by the solid line, and the result of the related art vibrator element is represented by the dashed line. Further, in FIG. 17, the data on the leftmost side show the amount of deflection of the vibrator element before the heating treatment, and the data toward the right side therefrom show the amount of deflection of the vibrator element in the case where the number of heating treatment operations was increased. It is found from the graph that in the vibrator element 200, almost no deflection occurred after the heating treatment; however, in the related art vibrator element, a large deflection occurred after the heating treatment. It is also found from the graph that also before the heating treatment, the absolute value (magnitude) of the amount of deflection of the vibrator element 200 is smaller as compared with the related art vibrator element.

In addition, as another effect, the variation in the frequency (frequency-temperature characteristics) among a plurality of vibrator elements 200 can be reduced, and thus, more homogeneous vibrator elements 200 with less variation in the frequency among the products as compared with the related art vibrator element can be produced. FIG. 18 is a graph obtained by preparing ten vibrator elements 200, and measuring the frequency-temperature characteristics of each vibrator element, and plotting the results on the same graph in an overlapped manner. On the other hand, FIG. 19 is a graph obtained by preparing ten related art vibrator elements, and measuring the frequency-temperature characteristics of each vibrator element, and plotting the results on the same graph. It is found from these graphs that the variation in the frequency-temperature characteristics among a plurality of vibrator elements 200 is sufficiently reduced as compared with the variation in the frequency-temperature characteristics among related art vibrator elements.

Incidentally, on the surface of the second metal film 222 on the opposite side to the surface in contact with the first metal film 221, a metal film may be further laminated. Further, in this embodiment, for all of the excitation electrodes 231 and 241, the connection electrodes 232 and 242, and the wiring electrodes 233 and 243, the first metal film 221 and the second metal film 222 are used, however, it is not limited thereto, and by using the first metal film 221 and the second metal film 222 for at least one of the excitation electrodes 231 and 241, the connection electrodes 232 and 242, and the wiring electrodes 233 and 243, at least part of the same effects as those of this embodiment and the first embodiment can be obtained.

Hereinabove, the electronic device of this embodiment has been described. Incidentally, in this embodiment, the configuration using the quartz crystal substrate as the piezoelectric substrate has been described, however, the piezoelectric substrate is not limited thereto, and a piezoelectric material such as a piezoelectric single crystal other than a quartz crystal substrate such as lithium niobate ($LiNbO_3$), lithium tantalite ($LiTaO_3$), lithium tetraborate ($Li_2B_4O_7$), or langasite ($La_3Ga_5SiO_{14}$), or a piezoelectric ceramic such as lead zirconate titanate (PZT) may be used. Further, in this embodiment, the piezoelectric effect of the quartz crystal substrate is used as a unit that excites the vibrator element 200; however, it is not limited thereto, and electrostatic driving by a Coulomb force may be used. Further, in this embodiment, the configuration using the quartz crystal substrate as the base material 110 of the vibrator element 200 has been described; however, it is not limited thereto, and a silicon semiconductor material, a glass, a ceramic, or the like can also be used. As the unit that excites the vibrator element 200, a piezoelectric material is formed on the base material 110, and the piezoelectric effect of the piezoelectric material may be used, or electrostatic driving by a Coulomb force may be used. In addition, the vibrator element 200 may be an SAW (Surface Acoustic Wave) resonator element or an MEMS (Micro Electro Mechanical Systems) vibrator element. Further, the vibrator element 200 may be an element that detects a physical quantity, for example, an element for an inertial sensor (an acceleration sensor, a gyro sensor, or the like), or a force sensor (an inclination sensor, or the like).

Third Embodiment

Figure 20:
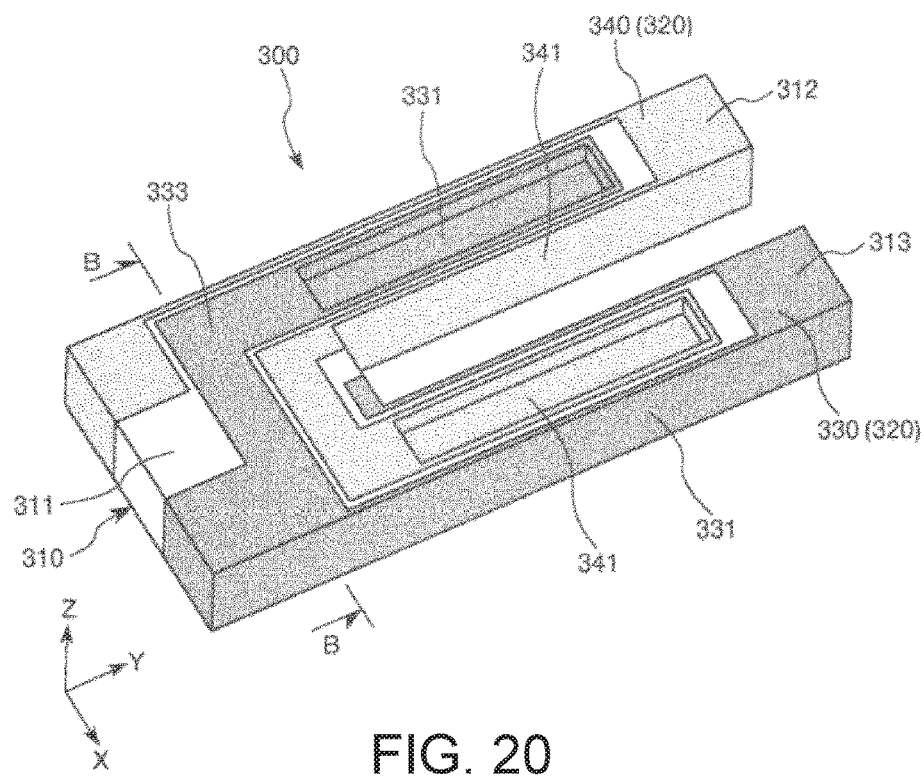
FIG. 20 is a perspective view of a vibrator element as an electronic device according to a third embodiment of the present disclosure seen from an upper side.
Figure 21:
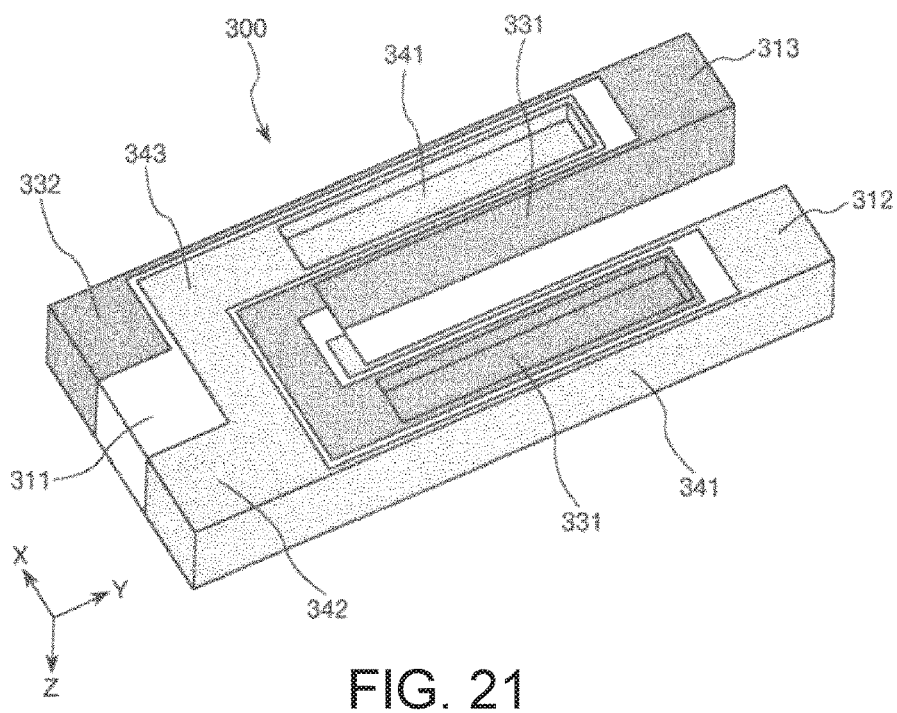
FIG. 21 is a perspective view of the vibrator element shown in FIG. 20 seen from a lower side.
Figure 22:
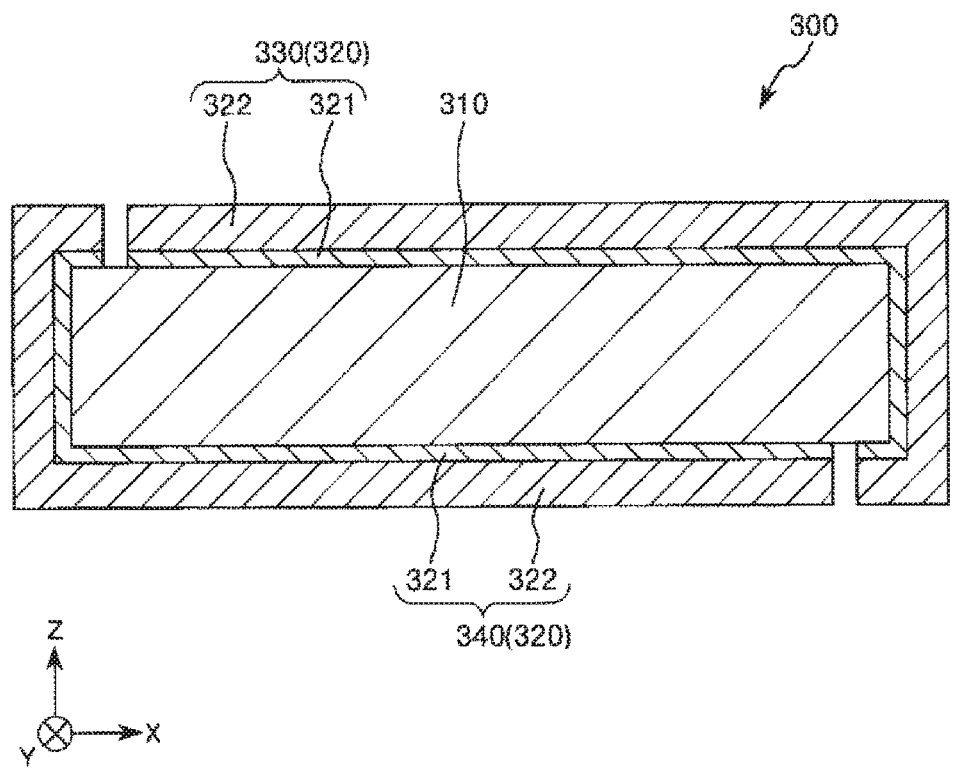
FIG. 22 is a cross-sectional view taken along the line B-B in FIG. 20.

FIG. 20 is a perspective view of a vibrator element as the electronic device according to a third embodiment of the present disclosure seen from an upper side. FIG. 21 is a perspective view of the vibrator element shown in FIG. 20 seen from a lower side. FIG. 22 is a cross-sectional view taken along the line B-B in FIG. 20.

Hereinafter, with respect to the electronic device (vibrator element) of the third embodiment, different points from the above-mentioned embodiments will be mainly described, and the description of the same matter will be omitted.

The electronic device according to the third embodiment of the present disclosure is the same as that of the above-mentioned second embodiment except that the shape of the vibrator element is different.

As shown in FIGS. 20 and 21, a vibrator element 300, which is an electronic device, includes a quartz crystal substrate (piezoelectric substrate) 310 and an electrode 320 formed on the quartz crystal substrate 310. In such a vibrator element 300, the quartz crystal substrate 310 corresponds to the base material 110 of the first embodiment, and the electrode 320 corresponds to the metal film structure 120.

The quartz crystal substrate 310 is a "Z-cut quartz crystal substrate" with the Z axis taken as the thickness direction. However, for example, the thickness direction of the quartz crystal substrate 310 may be slightly tilted with respect to the Z axis. Such a quartz crystal substrate 310 includes a base portion 311 and a pair of vibrating arms 312 and 313 extending in parallel with each other in the +Y-axis direction from the base portion 311. Further, a groove is formed on the upper surface (the surface on the +Z-axis side) and on the lower surface (the surface on the −Z-axis side) of the vibrating arm 312. A groove is also formed on the upper surface and on the lower surface of the vibrating arm 313. By forming such a groove, the thermoelastic loss can be reduced. Incidentally, a groove may not be formed on the upper surface and the lower surface of the vibrating arms 312 and 313, or a groove may be formed only at least one of the upper surface and the lower surface of the vibrating arms 312 and 313, or a groove may be formed only the upper surface and the lower surface of one of the vibrating arms 312 and 313, or a groove may be formed only one of the upper surface and the lower surface of one of the vibrating arms 312 and 313.

The electrode 320 includes a first electrode 330 and a second electrode 340. Further, the first electrode 330 includes an excitation electrode 331, a connection electrode 332, and a wiring electrode 333. Similarly, the second electrode 340 includes an excitation electrode 341, a connection electrode 342, and a wiring electrode 343.

The excitation electrode 331 is disposed on the upper surface and the lower surface of the vibrating arm 312 and both side surfaces of the vibrating arm 313. The excitation electrode 341 is disposed on both side surfaces of the vibrating arm 312 and on the upper surface and the lower surface of the vibrating arm 313. Further, the connection electrodes 332 and 342 are disposed on the base portion 311. The wiring electrode 333 is disposed so as to connect the excitation electrode 331 and the connection electrode 332, and the wiring electrode 343 is disposed so as to connect the excitation electrode 341 and the connection electrode 342.

As shown in FIG. 22, the first and second electrodes 330 and 340 have a two-layer laminated structure including a first metal film 321 disposed in contact with a surface of the quartz crystal substrate 310 and a second metal film 322 formed (laminated) in contact with a surface of the first metal film 321 on the opposite side to the surface in contact with the quartz crystal substrate 310. The first metal film 321 has the same configuration as that of the first metal film 121 of the first embodiment, and the second metal film 322 has the same configuration as that of the second metal film 122 of the first embodiment. Therefore, the diffusion of Cr into the second metal film 322 is reduced, and thus, the same effect as that of the first and second embodiments can be exhibited. Incidentally, in this embodiment, a so-called tuning fork-type vibrator element having a pair of vibrating arms has been described as an example; however, it is not limited thereto. For example, the vibrator element may be an element that includes at least two pair of vibrating arms and detects a physical quantity to be applied to the vibrator element by driving the vibrator element with one pair of vibrating arms, and detecting an external force to be applied to the vibrator element with the other pair of vibrating arms. Such a vibrator element may be used for an inertial sensor (an acceleration sensor, a gyro sensor, or the like), or a force sensor (an inclination sensor, or the like).

Fourth Embodiment

Figure 23:
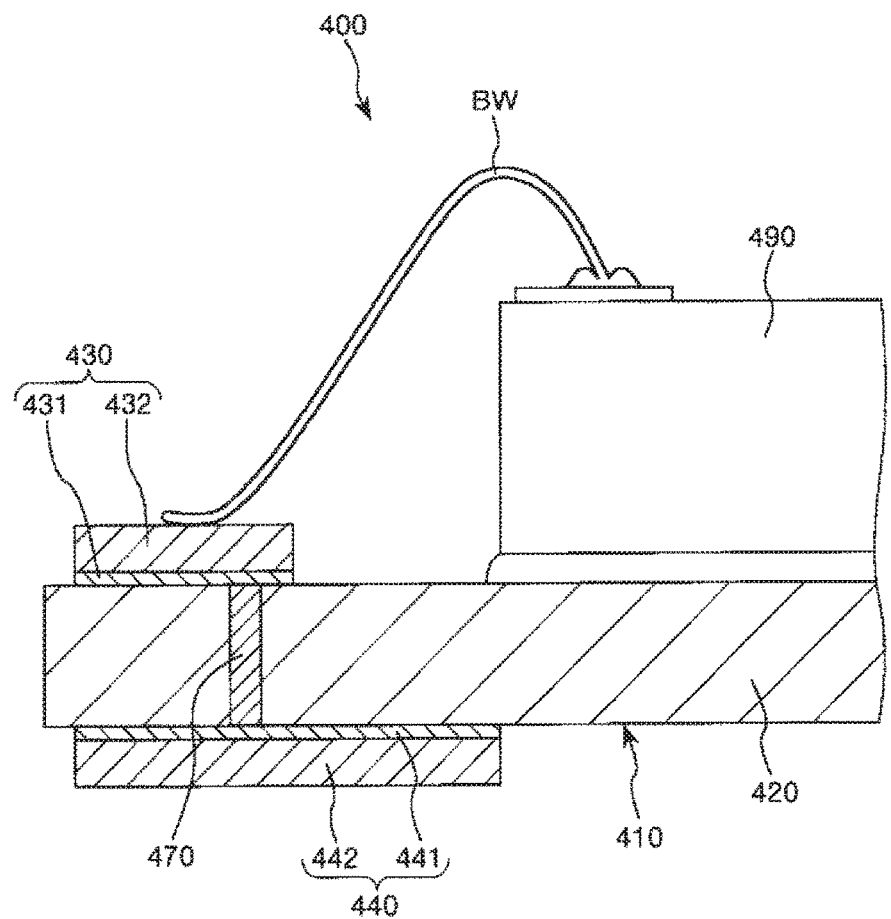
FIG. 23 is a cross-sectional view of an electronic device according to a fourth embodiment of the present disclosure.

FIG. 23 is a cross-sectional view of an electronic device according to a fourth embodiment of the present disclosure.

Hereinafter, with respect to the electronic device of the fourth embodiment, different points from the above-mentioned embodiments will be mainly described, and the description of the same matter will be omitted.

As shown in FIG. 23, an electronic device 400 includes an electronic component-mounting substrate 410 and an electronic component 490 such as an IC mounted on the electronic component-mounting substrate 410. Further, the electronic component-mounting substrate 410 includes a substrate 420, a terminal 430 disposed on the upper surface of the substrate 420 and electrically connected to the electronic component 490 through a bonding wire BW, and a terminal 440 disposed on the lower surface of the substrate 420 and electrically connected to the terminal 430 through a via 470. In such an electronic device 400, the substrate 420 corresponds to the base material 110 of the first embodiment, and the terminals 430 and 440 correspond to the metal film structure 120. Incidentally, also a terminal present on the upper surface side of the electronic component 490 and connected to the bonding wire BW may be constituted by the metal film structure 120.

The substrate 420 is not particularly limited, and for example, a silicon substrate, a glass substrate, a ceramic substrate, and the like can be used. Incidentally, a glass material constituting the glass substrate is not particularly limited, and for example, borosilicate glass, quartz glass, soda glass (soda-lime glass), potassium glass, alkali-free glass, and the like can be used. Further, a material constituting the ceramic substrate is not particularly limited, and for example, various types of ceramics including oxide-based ceramics such as aluminum oxide and zirconium oxide, nitride-based ceramics such as aluminum nitride and silicon nitride, carbide-based ceramics such as silicon carbide, and the like can be used.

The terminal 430 has a two-layer laminated structure including a first metal film 431 disposed in contact with a surface of the substrate 420 and a second metal film 432 formed (laminated) in contact with a surface of the first metal film 431 on the opposite side to the surface in contact with the substrate 420. Similarly, the terminal 440 has a two-layer laminated structure including a first metal film 441 disposed in contact with a surface of the substrate 420 and a second metal film 442 formed (laminated) in contact with a surface of the first metal film 441 on the opposite side to the surface in contact with the substrate 420.

The first metal films 431 and 441 have the same configuration as that of the first metal film 121 of the first embodiment, and the second metal films 432 and 442 have the same configuration as that of the second metal film 122 of the first embodiment. Therefore, the diffusion of Cr into the second metal films 432 and 442 is reduced, and thus, the same effect as that of the first embodiment can be exhibited. That is, the adhesiveness of the substrate 420 to the first metal films 431 and 441 and the adhesiveness of the first metal films 431 and 441 to the second metal films 432 and 442 can be increased, and also the bonding strength between the terminal 430 and the bonding wire BW can be increased. Incidentally, on the surface of the second metal film 432 on the opposite side to the surface in contact with the first metal film 431, and on the surface of the second metal film 442 on the opposite side to the surface in contact with the first metal film 441, a metal film may be further laminated.

Fifth Embodiment

Figure 24:
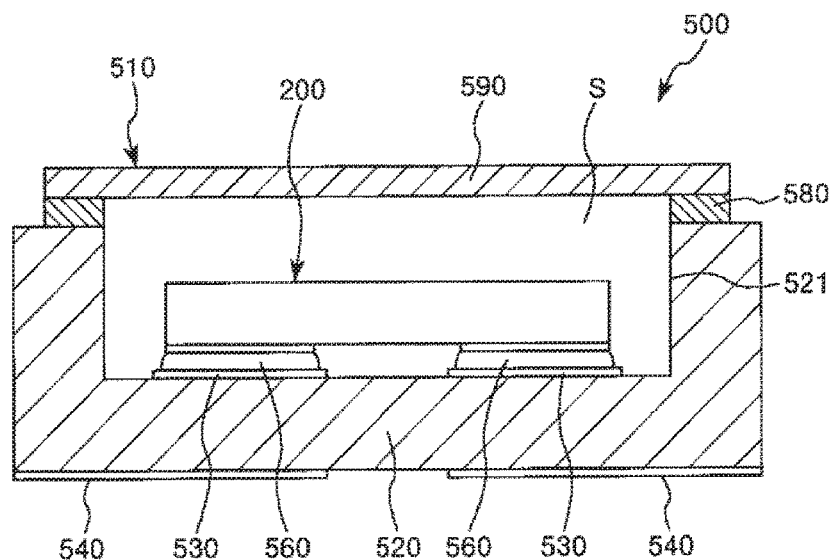
FIG. 24 is a cross-sectional view of a vibrator which is an electronic device according to a fifth embodiment of the present disclosure.
Figure 25:
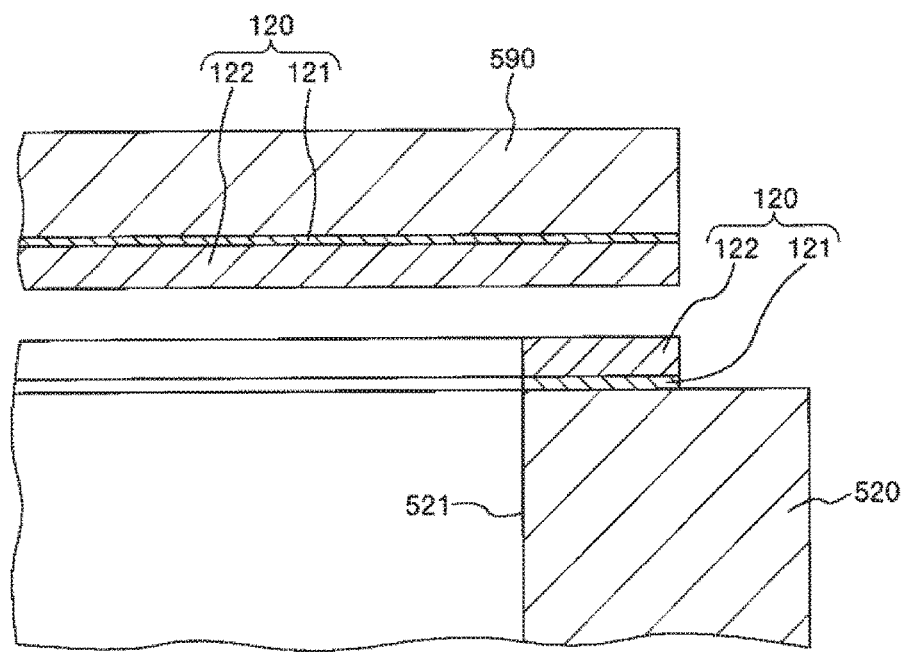
FIG. 25 is an enlarged cross-sectional view showing a base and a lid before bonding.

FIG. 24 is a cross-sectional view of a vibrator which is an electronic device according to a fifth embodiment of the present disclosure. FIG. 25 is an enlarged cross-sectional view showing a base and a lid before bonding.

Hereinafter, with respect to the electronic device of the fifth embodiment, different points from the above-mentioned embodiments will be mainly described, and the description of the same matter will be omitted.

As shown in FIG. 24, a vibrator 500, which is an electronic device, includes the vibrator element 200 and a package 510 that houses the vibrator element 200. Further, the package 510 includes a base 520 in the form of a cavity having a concave portion 521 and a lid 590 bonded to the base 520 through a bonding layer 580. The vibrator element 200 is housed in a housing space S formed by closing the concave portion 521 by the lid 590. The housing space S may be, for example, in a reduced pressure (vacuum) state. Further, an inert gas such as nitrogen, helium, or argon may be enclosed therein.

A constituent material of the base 520 is not particularly limited. For example, various types of ceramics including oxide-based ceramics such as aluminum oxide and zirconium oxide, nitride-based ceramics such as aluminum nitride and silicon nitride, carbide-based ceramics such as silicon carbide, glass materials, silicon, and the like can be used. Further, a constituent material of the lid 590 is not particularly limited. For example, various types of ceramics including oxide-based ceramics such as aluminum oxide and zirconium oxide, nitride-based ceramics such as aluminum nitride and silicon nitride, carbide-based ceramics such as silicon carbide, glass materials, silicon, metals, and the like can be used. Further, the constituent material of the lid 590 is preferably a member having a linear expansion coefficient approximated to that of the constituent material of the base 520. For example, in the case where a ceramic as described above is used as the constituent material of the base 520, it is preferred to use an alloy such as Kovar as the constituent material of the lid 590.

Further, in the base 520, an internal terminal 530 and an external terminal 540 electrically connected to the internal terminal 530 through an internal wiring (not shown) are disposed. The vibrator element 200 is fixed to the internal terminal 530 through an electrically conductive adhesive in which an electrically conductive filler, such as Au, Ag, Cu, or Al, is dispersed in a resin material, such as a silicone-based, epoxy-based, acrylic, polyimide-based, or bismaleimide-based resin material, or an electrically conductive bonding member 560, such as a metal bump or a solder. In such a vibrator 500, the base 520 and the lid 590 correspond to the base material 110 of the first embodiment, and the internal terminal 530 and the external terminal 540 correspond to the metal film structure 120, and further, the bonding layer 580 is formed based on the metal film structure 120.

As shown in FIG. 25, on the upper surface of the base 520 before bonding, the metal film structure 120 for bonding is disposed, and similarly, also on the lower surface of the lid 590, the metal film structure 120 for bonding is disposed. At least one of pressurization and heating is performed in a state where these metal film structures 120 are brought into contact with each other, whereby the bonding layer 580 is formed, and the base 520 and the lid 590 are bonded to each other. As described above, a Cr oxide film is hardly formed on the surface of the second metal film 122, and therefore, the second metal films 122 can be bonded to each other more strongly. Incidentally, the metal film structure 120 on the upper surface of the base 520 and the metal film structure 120 on the lower surface of the lid 590 may be bonded through an electrically conductive adhesive or an electrically conductive bonding member, such as a metal film, a solder, or a brazing material. Further, the metal film structure 120 for bonding may be formed on one side of the upper surface of the base 520 and the lower surface of the lid 590, and on the other side of the upper surface of the base 520 and the lower surface of the lid 590, an electrically conductive adhesive, a metal film, a solder, a brazing material, or the like for bonding to the metal film structure may be formed.

Hereinabove, the embodiment has been described; however, for example, by housing an IC chip including an oscillation circuit that oscillates the vibrator element 200 in the package 510 of the vibrator 500 of this embodiment, the electronic device may be used as an oscillator. Hereinafter, one example of this oscillator will be described.

Figure 26:
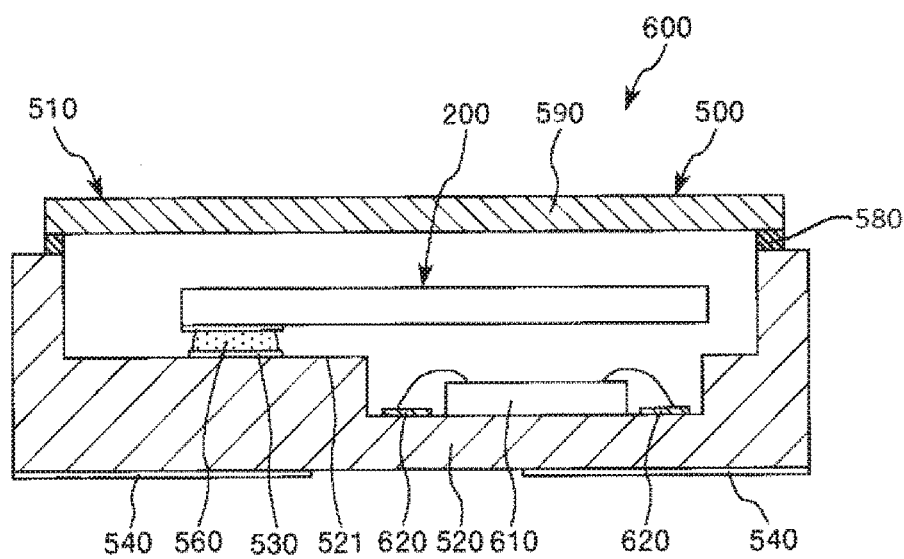
FIG. 26 is a cross-sectional view of an oscillator as a modification of an electronic device.

FIG. 26 is a cross-sectional view of an oscillator as a modification of the electronic device. An oscillator 600 shown in FIG. 26 includes a vibrator 500 and an IC chip 610 for driving a vibrator element 200. In such an oscillator 600, the IC chip 610 is fixed to a concave portion 521 of a base 520. The IC chip 610 is electrically connected to a plurality of connection terminals 620 formed on the bottom surface of the concave portion 521. Among the plurality of connection terminals 620, some are connected to an internal terminal 530 and some are connected to an external terminal 540. The IC chip 610 includes an oscillation circuit for controlling the driving of the vibrator element 200, and when the vibrator element 200 is driven by the IC chip 610, a signal with a predetermined frequency can be extracted.

Sixth Embodiment

Figure 27:
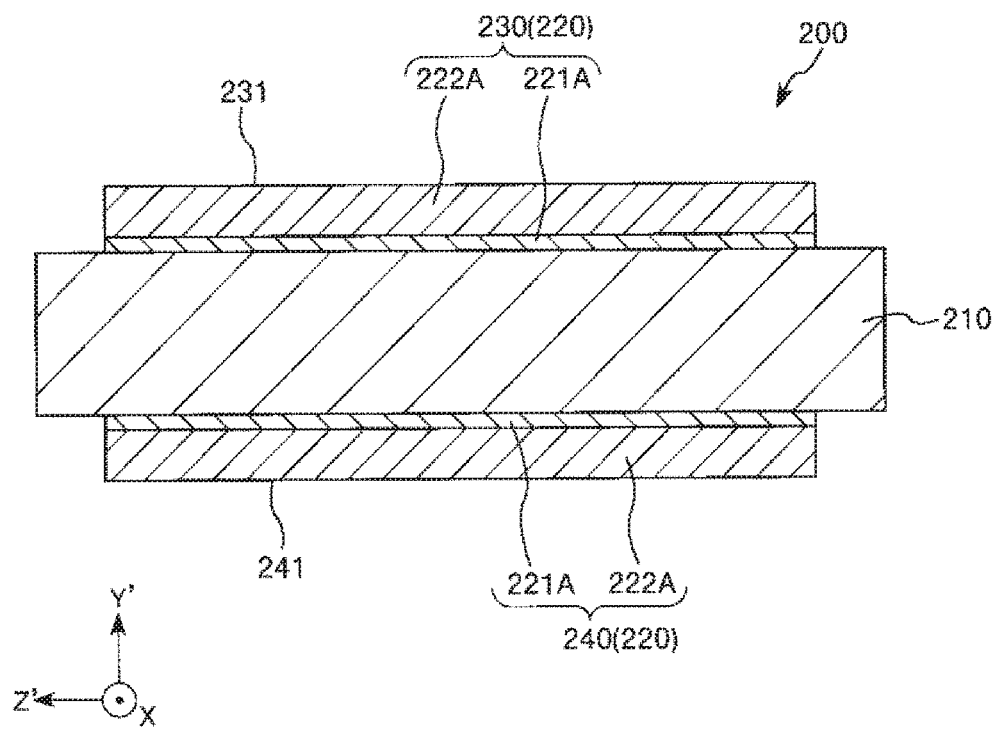
FIG. 27 is a cross-sectional view of a vibrator element as an electronic device according to a sixth embodiment of the present disclosure.
Figure 28:
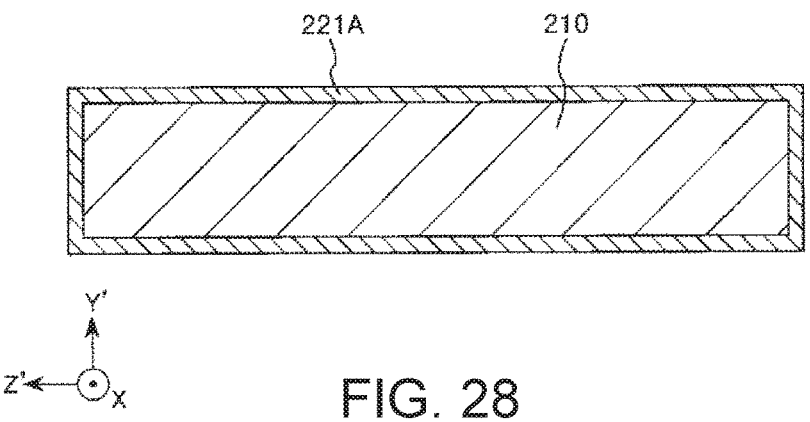
FIG. 28 is a cross-sectional view for explaining a method for producing the vibrator element shown in FIG. 27.
Figure 29:
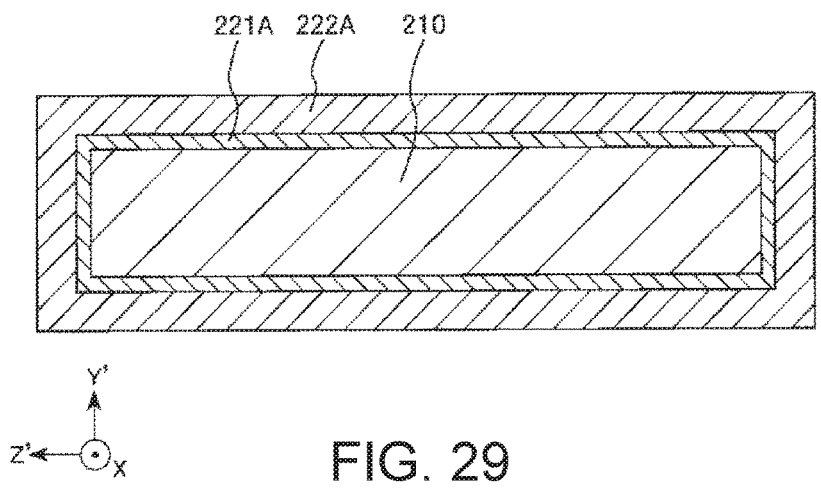
FIG. 29 is a cross-sectional view for explaining a method for producing the vibrator element shown in FIG. 27.
Figure 30:
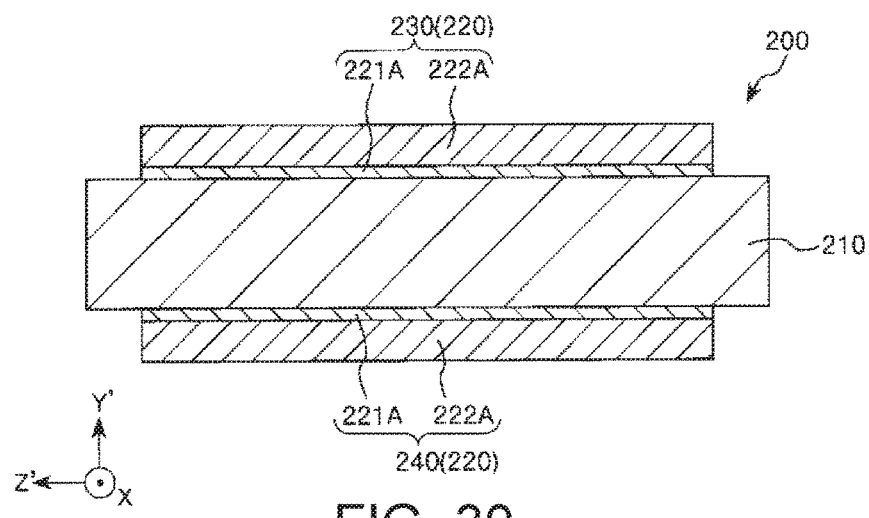
FIG. 30 is a cross-sectional view for explaining a method for producing the vibrator element shown in FIG. 27.
Figure 31A:
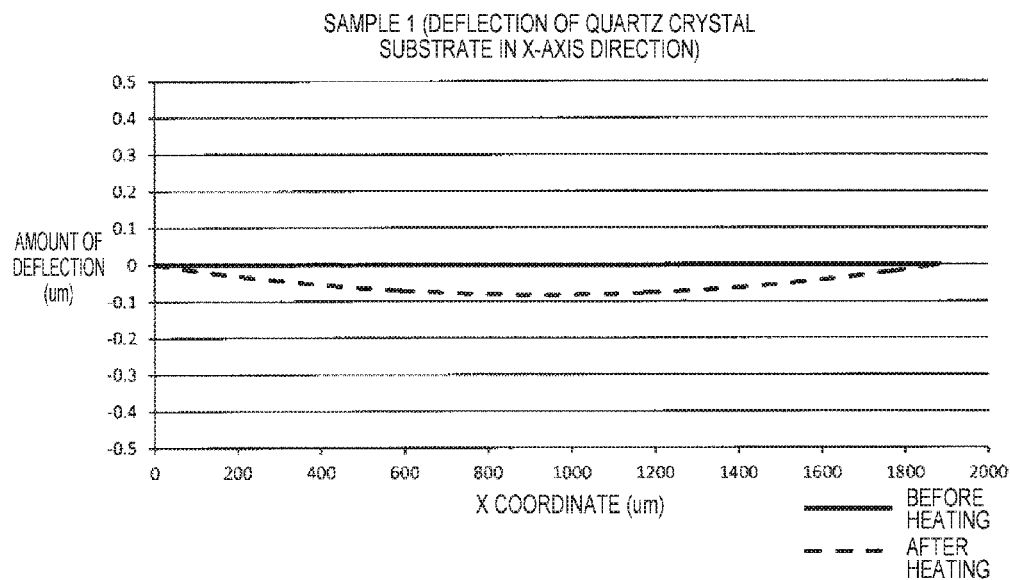
FIGS. 31A and 31B are graphs showing the amount of deflection of Sample 1.
Figure 31B:
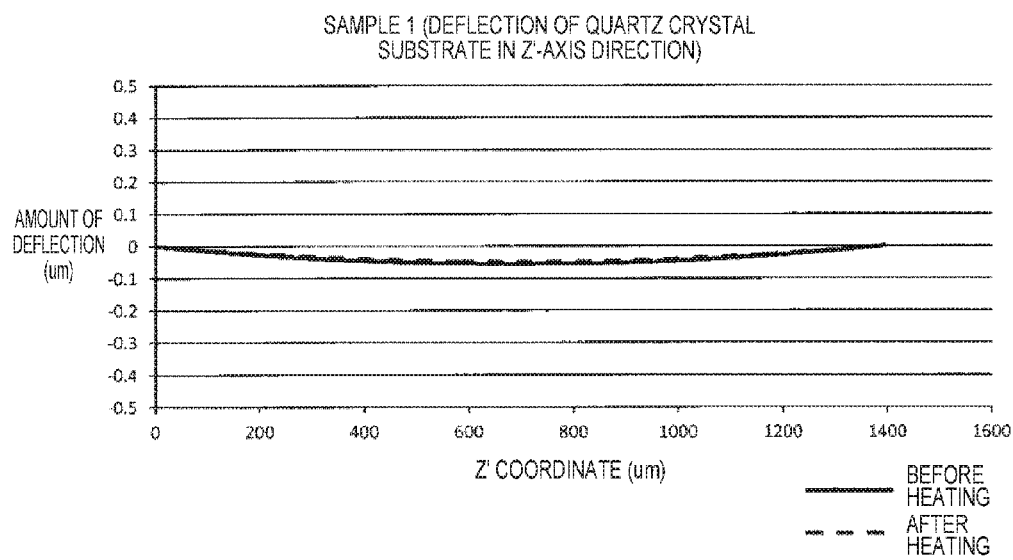
Figure 32A:
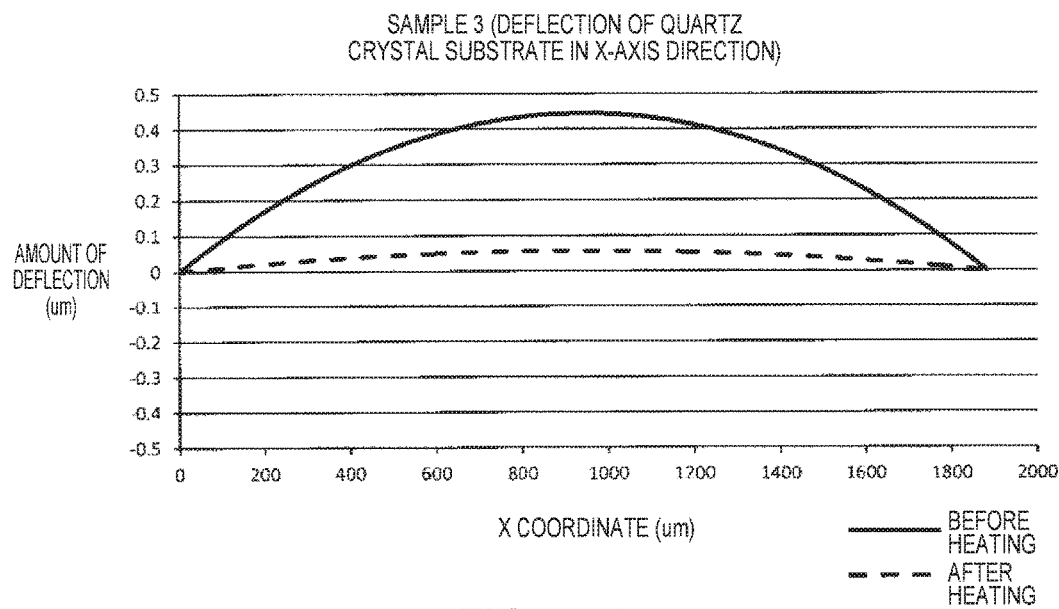
FIGS. 32A and 32B are graphs showing the amount of deflection of Sample 3.
Figure 32B:
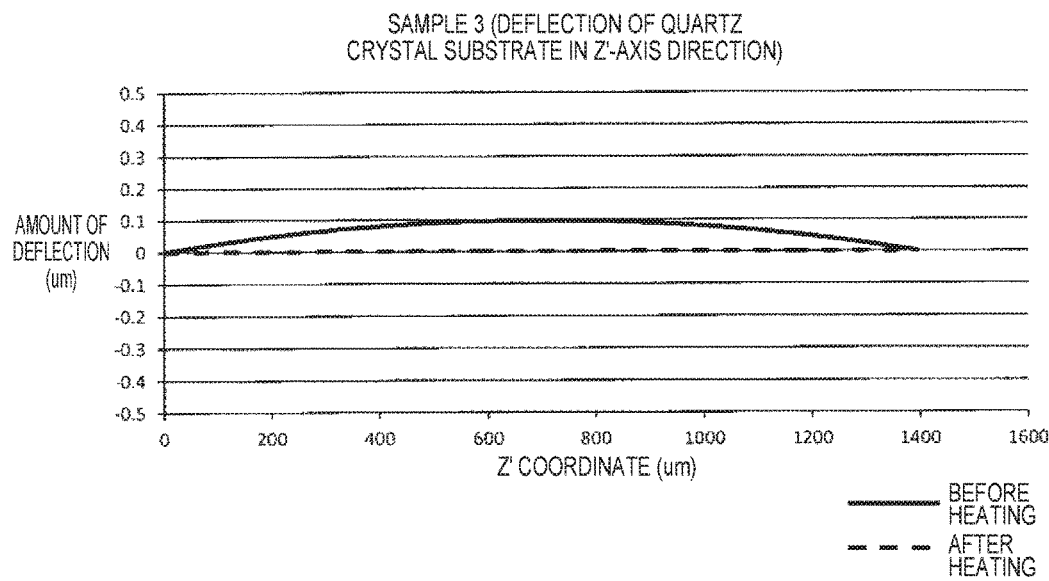
Figure 33:
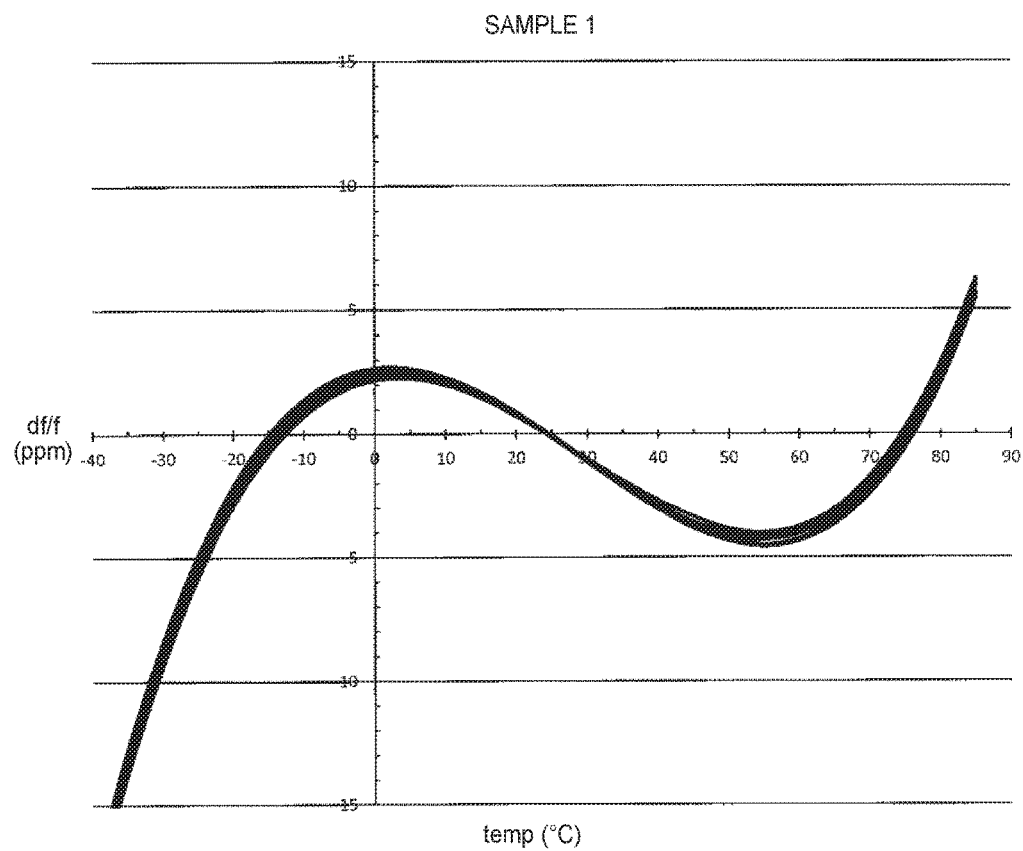
FIG. 33 is a graph showing a variation in the frequency-temperature characteristics of Sample 1.
Figure 34:
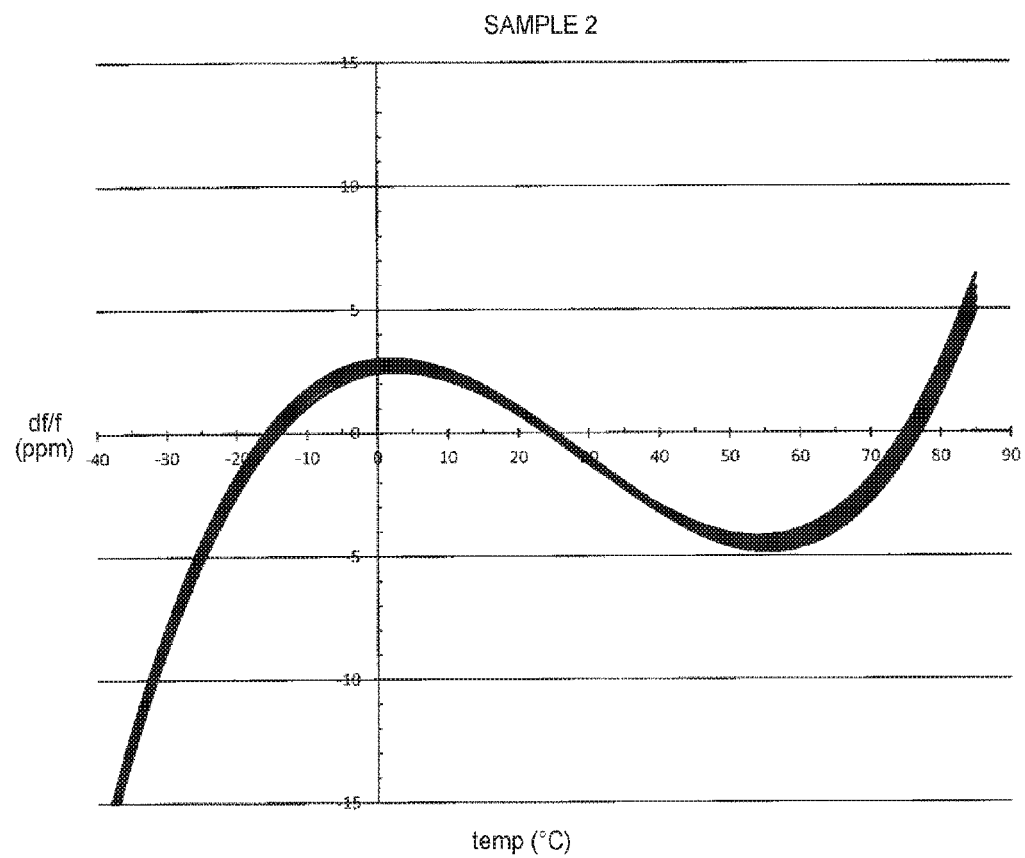
FIG. 34 is a graph showing a variation in the frequency-temperature characteristics of Sample 2.
Figure 35:
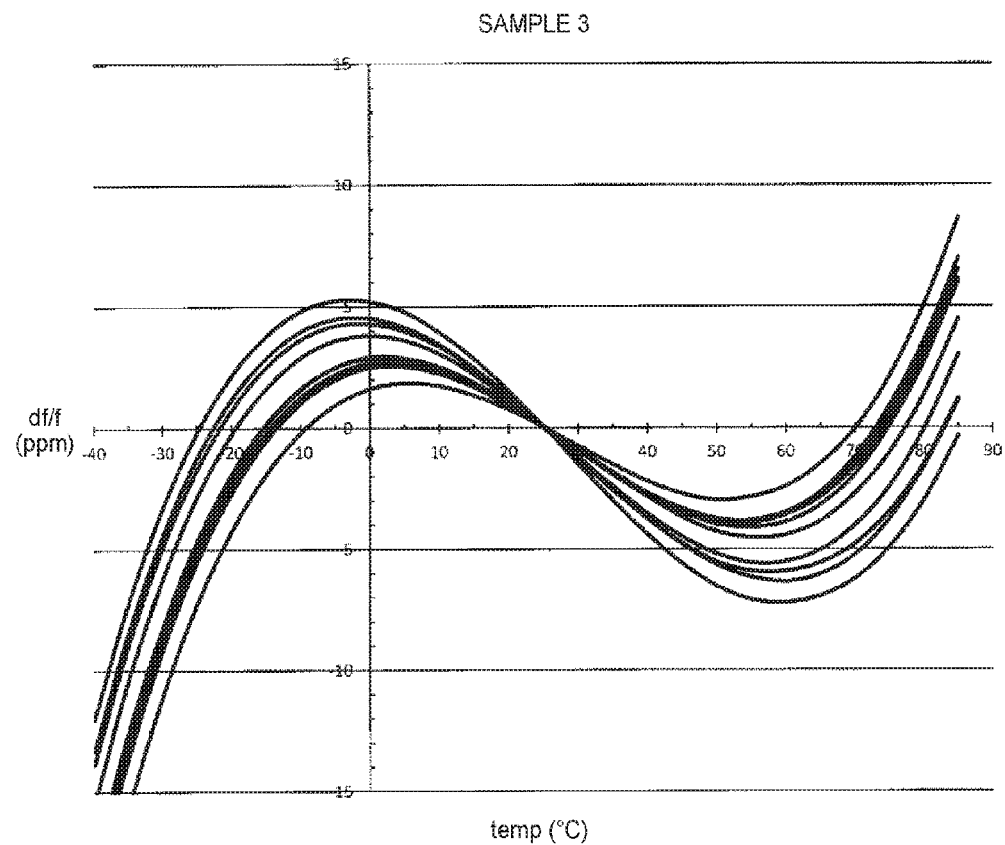
FIG. 35 is a graph showing a variation in the frequency-temperature characteristics of Sample 3.

FIG. 27 is a cross-sectional view of a vibrator element as the electronic device according to a sixth embodiment of the present disclosure. FIGS. 28 to 30 are cross-sectional views each for explaining a method for producing the vibrator element shown in FIG. 27. FIGS. 31A and 31B are graphs showing the amount of deflection of Sample 1. FIGS. 32A and 32B are graphs showing the amount of deflection of Sample 3. FIG. 33 is a graph showing a variation in the frequency-temperature characteristics of Sample 1. FIG. 34 is a graph showing a variation in the frequency-temperature characteristics of Sample 2. FIG. 35 is a graph showing a variation in the frequency-temperature characteristics of Sample 3. Incidentally, FIG. 27 is a view corresponding to the cross-sectional view taken along the line A-A in FIG. 14.

Hereinafter, with respect to the electronic device of the sixth embodiment, different points from the above-mentioned embodiments will be mainly described, and the description of the same matter will be omitted.

The electronic device according to the sixth embodiment is the same as that of the second embodiment except that the configuration of the electrode is different. Further, the same components as those in the second embodiment will be denoted by the same reference numerals.

As shown in FIG. 27, an electrode 220 (a first electrode 230 and a second electrode 240) has a two-layer laminated structure including a first metal film 221A disposed in contact with a surface of a quartz crystal substrate 210 and a second metal film 222A formed (laminated) in contact with a surface of the first metal film 221A on the opposite side to the surface in contact with the quartz crystal substrate 210.

The first metal film 221A is constituted by an oxide of a metal material (hereinafter also referred to as "main component metal material") as a main material. As will also be described in the below-mentioned production method, the first metal film 221A is formed by depositing the main component metal material in an $O_2$ (oxygen)-containing atmosphere. According to such a method, the first metal film 221A can be easily formed. In this manner, by constituting the first metal film 221A by a metal oxide, the first metal film 221A is stabilized as compared with the case where the first metal film 221A is constituted by Cr (metal material) as in the related art, and thus, the possibility that the main component metal material in the first metal film 221A diffuses into the second metal film 222A is reduced.

Therefore, first, the increase in the resistance value of the second metal film 222A is suppressed, and thus, the vibrator element 200 has a low CI value. In addition, secondarily, for example, the deposition of the main component metal material of the first metal film 221A on the surface of the second metal film 222A is reduced, and the possibility that an oxide film which is formed by oxidation of the main component metal material of the first metal film 221A is formed on the surface of the second metal film 222A is reduced. Due to this, the change in the mass over time of the first and second electrodes 230 and 240 may be suppressed. Specifically, the increase in the mass due to bonding of an oxygen (O) atom to Cr deposited on the surface of the second metal film 222A (oxidation) can be suppressed to be small (preferably can be suppressed to substantially 0). According to this, the vibrator element 200 is configured such that the change in the resonance frequency over time (e.g., the fluctuation in the resonance frequency of the vibrator element 200 over time, the fluctuation in the frequency-temperature characteristics of the vibrator element 200 over time, etc.) in the vibrator element 200 is small, the variation in the frequency-temperature characteristics among a plurality of vibrator elements 200 is small, and so on. In addition, since the possibility that an oxide film of the main component metal material of the first metal film 221A is formed on the surface of the second metal film 222A is reduced, an undesirable deflection of the quartz crystal substrate 210 due to stress generated by an oxide film of the main component metal material of the first metal film 221A can also be effectively reduced. Moreover, thirdly, the variation in the frequency (particularly, the frequency-temperature characteristics) among a plurality of vibrator elements 200 can be reduced, and thus, more homogeneous vibrator elements 200 with less variation in the frequency among the products as compared with the related art vibrator element can be produced.

Here, the oxidation ratio A of the first metal film 221A is not particularly limited, but preferably satisfies the following relationship: $20\% \leq A \leq 50\%$, and more preferably satisfies the following relationship: $23\% \leq A \leq 40\%$. In this manner, by forming the first metal film 221A as an oxide film in an incompletely oxidized state, the first metal film 221A is capable of effectively reducing the diffusion of the metal component into the second metal film 222A while maintaining the adhesiveness between the quartz crystal substrate 210 and the second metal film 222A at a sufficiently high level.

Incidentally the "oxidation ratio A" as used in this embodiment can be obtained from the oxygen content in the first metal film 221A. That is, the oxygen content in the first metal film 221A when the main component metal material of the first metal film 221A is completely oxidized (in the case where the main component metal material is Cr, when the total Cr in the first metal film 221A is converted to $Cr_2O_3$) is represented by N1, and the actual oxygen content in the first metal film 221A is represented by N2. Accordingly, the oxidation ratio A can be obtained according to the following formula: $(N2/N1) \times 100(\%)$. In addition, the oxygen content can be specified by a qualitative and quantitative analysis, such as X-ray photoelectron spectroscopy, secondary ion mass spectrometry, an electron probe micro-analysis method, Auger electron spectroscopy, or an X-ray fluorescence analysis method.

Further, the oxidation ratio A of the first metal film 221A is preferably substantially uniform throughout the first metal film 221A. In particular, the oxidation ratio A is preferably substantially constant along the thickness direction of the first metal film 221A. For example, when the oxidation ratio on the upper surface of the first metal film 221A (the surface on the second metal film 222A side) is represented by A1, and the oxidation ratio on the lower surface of the first metal film 221A (the surface on the quartz crystal substrate 210 side) is represented by A2, it is preferred to satisfy the following relationship: $0\% \leq |A1-A2| \leq 2\%$, and it is more preferred to satisfy the following relationship: $0\% \leq |A1-A2| \leq 1\%$. According to this, the first metal film 221A which is homogeneous is obtained, and thus, the above-mentioned effect can be more effectively exhibited.

As the main component metal material of such a first metal film 221A, the first metal film 221A is preferably constituted by, as a main material, a material having high adhesiveness to the quartz crystal substrate 210 and the second metal film 222A, specifically, a metal element such as chromium (Cr), nickel (Ni), titanium (Ti), tungsten (W), molybdenum (Mo), silver (Ag), or aluminum (Al), or an oxide thereof. In addition, the main component metal material is preferably chromium (Cr) or nickel (Ni) among these. According to this, an oxide can be relatively easily formed. Incidentally, the first metal film 221A may contain, in addition to the above-mentioned main material, a metal element other than the above-mentioned elements or a non-metal element (e.g., Si, C, B, or the like).

The average thickness of the first metal film 221A is not particularly limited, but is preferably about 3 nm or more and 300 nm or less, and more preferably, about 5 nm or more and 250 nm or less. By setting the average thickness of the first metal film 221A within the above range, sufficient adhesiveness to the quartz crystal substrate 210 is ensured.

On the other hand, as a constituent material of the second metal film 222A, a material having particularly high electrical conductivity, specifically, a noble metal element such as gold (Au) or platinum (Pt) is used. According to this, the first and second electrodes 230 and 240 having excellent electrical conductivity are obtained. Incidentally, the second metal film 222A may contain, in addition to the above-mentioned main material, a metal element other than the above-mentioned elements or a non-metal element (e.g., Si, C, B, or the like).

The average thickness of the second metal film 222A is not particularly limited, but is preferably, for example, about 10 nm or more and 1000 nm or less, and more preferably, about 20 nm or more and 800 nm or less.

Next, a method for producing the vibrator element 200 will be described. The method for producing the vibrator element 200 includes a first film forming step of forming a first metal film 221A on a quartz crystal substrate 210, a second film forming step of forming a second metal film 222A on the first metal film 221A, and a patterning step of patterning the first metal film 221A and the second metal film 222A, thereby forming a first electrode 230 and a second electrode 240 (electrode 220). Hereinafter, the respective steps will be sequentially described.

First Film Forming Step

First, as shown in FIG. 28, the first metal film 221A is formed on the surface of the quartz crystal substrate 210. Specifically, while supplying oxygen (an oxidizing agent), a main component metal material (Cr, Ni, or the like) of the first metal film 221A is deposited on the quartz crystal substrate 210 by any of various gas-phase deposition methods, such as a vacuum vapor deposition method and a sputtering method. By doing this, the main component metal material is deposited and also oxidized, whereby the first metal film 221A containing an oxide of the main component metal material as a main material is obtained on the quartz crystal substrate 210. According to such a method, the first metal film 221A having a uniform oxidation ratio can be easily formed. Incidentally, the supply amount of oxygen is not particularly limited, but is preferably about 5 sccm (standard cc/min) or more and 10 sccm or less (sccm: the amount of gas flowing per minute under conditions of 1 atm and 25° C. (1 cc=1 $cm^3$)).

Second Film Forming Step

Subsequently, as shown in FIG. 29, the second metal film 222A is formed on the surface of the first metal film. 221A. The second metal film 222A is obtained by depositing a constituent material (Au, Pt, or the like) of the second metal film 222A on the first metal film 221A by any of various gas-phase deposition methods, such as a vacuum vapor deposition method and a sputtering method.

Patterning Step

Subsequently, as shown in FIG. 30, by patterning a laminate of the first and second metal films 221A and 222A, the first and second electrodes 230 and 240 are obtained. The patterning of the laminate can be performed using a photolithography technique and an etching technique (wet etching, dry etching, or the like). In this manner, the vibrator element 200 is obtained.

According to such a production method, the first metal film 221A can be stabilized before forming the second metal film 222A, and therefore, after forming the second metal film 222A, the diffusion of the metal material in the first metal film 221A into the second metal film 222A can be effectively reduced. In addition, according to such a production method, it is also possible to continuously perform the first film forming step and the second film forming step. That is, in the film forming steps, the first film forming step and the second film forming step can also be performed continuously without taking out the quartz crystal substrate 210 from a chamber for forming the metal films (film forming chamber), and therefore, it is also possible to easily produce the vibrator element 200.

Next, the effect of this embodiment will be described with reference to experimental results.

Production of Vibrator Element
Sample 1

First, an AT-cut quartz crystal substrate was prepared, and chromium was deposited on the quartz crystal substrate by a vapor deposition method while supplying oxygen. By doing this, a first metal film containing chromium oxide as a main material was obtained. The supply amount of oxygen was set to 5 sccm (1 atm, 25° C.). Subsequently, gold was deposited on the first metal film by a vapor deposition method. By doing this, a second metal film was obtained. Subsequently, a laminate composed of the first metal film and the second metal film was patterned by photolithography and wet etching, whereby an electrode was obtained. In this manner, a vibrator element including an electrode having a two-layer structure was produced. Incidentally, the structure of the electrode is as follows.

Structure of Electrode

Main component of first metal film: chromium oxide ($Cr_2O_3$)
Average thickness of first metal film: 15 nm
Oxidation ratio of first metal film: 40%
Main component of second metal film: gold (Au)
Average thickness of second metal film: 200 nm Sample 2

A vibrator element was produced in the same manner as the above-mentioned Sample 1 except that the supply amount of oxygen when forming the first metal film was changed to 10 sccm (1 atm, 25° C.). Incidentally, the structure of the obtained electrode is as follows.

Structure of Electrode

Main component of first metal film: chromium oxide ($Cr_2O_3$)
Average thickness of first metal film: 15 nm
Oxidation ratio of first metal film: 40%
Main component of second metal film: gold (Au)
Average thickness of second metal film: 200 nm Sample 3

A vibrator element was produced in the same manner as the above-mentioned Sample 1 except that oxygen was not supplied when forming the first metal film. That is, first, an AT-cut quartz crystal substrate was prepared, and chromium was deposited on the quartz crystal substrate by a vapor deposition method without supplying oxygen, whereby a first metal film containing chromium as a main material was obtained. Subsequently, gold was deposited on the first metal film by a vapor deposition method, whereby a second metal film containing gold as a main material was obtained. Subsequently, a laminate composed of the first metal film and the second metal film was patterned by photolithography and wet etching, whereby an electrode was obtained. In this manner, a vibrator element including an electrode having a two-layer structure was produced. Incidentally, the structure of the electrode is as follows.

Structure of Electrode

Main component of first metal film: chromium
Average thickness of first metal film: 15 nm
Main component of second metal film: gold
Average thickness of second metal film: 200 nm Sample 4

A vibrator element was produced in the same manner as the above-mentioned Sample 1 except that the first metal film was omitted. Incidentally, the structure of the electrode is as follows.

Structure of Electrode

Main component of second metal film: gold
Average thickness of second metal film: 200 nm Evaluation of Vibrator Element With respect to the respective Samples 1 to 4, the following evaluation was performed.

Peel Strength

With respect to the vibrator elements obtained in Samples 1 to 4 (ten vibrator elements were prepared for each sample), the peel strength between the quartz crystal substrate and the electrode was evaluated. The evaluation of the peel strength was performed in accordance with the 90° peel test (JIS Z 0237). The results are shown in the following Table 1. In Table 1, with respect to each sample, an average of the results of the ten vibrator elements is shown.

TABLE 1

|  | Peel strength (N/m) |
| --- | --- |
| Sample 1 | 121.3 |
| Sample 2 | 119.4 |
| Sample 3 | 127.0 |
| Sample 4 | 53.7 |

As found from Table 1, Samples 1 and 2 have a peel strength comparable to that of Sample 3. Therefore, it is found that Samples 1 and 2 are vibrator elements having high adhesiveness between the quartz crystal substrate and the electrode, and thus having an excellent mechanical strength.

Deflection of Quartz Crystal Substrate

With respect to the vibrator elements obtained in Sample 1 and Sample 3, a heating treatment was performed under conditions of 260° C. for 2 hours, and the deflection of the quartz crystal substrate before and after the heating treatment was evaluated. The results are shown in FIGS. 31A and 32B.

As found from FIGS. 31A and 31B, in the vibrator element of Sample 1, almost no deflection occurred in the quartz crystal substrate before heating and after heating in both the X-axis and the Z'-axis directions, and also a change in the amount of deflection before and after heating is small. On the other hand, as found from FIGS. 32A and 32B, in Sample 3, a deflection occurred in the quartz crystal substrate before heating in both the X-axis and the Z'-axis directions, and particularly in the X-axis direction, a large deflection occurred. Further, in Sample 3, a large change in the amount of deflection of the quartz crystal substrate before and after heating occurred, particularly in the X-axis direction. This is presumed to be because in Sample 1, the diffusion of Cr in the first metal film into the second metal film is reduced, and as a result, the formation of an oxide film of Cr ($Cr_2O_3$) caused by the deposition of Cr on the surface of the second metal film is reduced. According to this, the deflection of the quartz crystal substrate is reduced, and also the change in the amount of deflection of the quartz crystal substrate before and after heating is reduced. Thus, it is found that the vibrator element obtained in Sample 1 is a vibrator element with less change in frequency over time.

Frequency-Temperature Characteristics

With respect to the vibrator elements obtained in Samples 1, 2, and 3 (ten vibrator elements were prepared for each sample), the frequency-temperature characteristics were evaluated. The results are shown in FIGS. 33 to 35. It is found from FIGS. 33 to 35 that in Samples 1 and 2, the variation in the frequency-temperature characteristics among the ten vibrator elements is sufficiently reduced as compared with Sample 3.

Hereinabove, the embodiment has been described. In this embodiment, the first metal film 221A is constituted by an oxide of a metal material as a main material, however, the first metal film 221A may be constituted by a nitride of a metal material as a main material. Even when the first metal film 221A is constituted by a nitride of a metal material as a main material, the same effect as that of this embodiment can be exhibited. In this case, the first metal film 221A can be formed by depositing the main component metal material in a nitrogen-containing atmosphere. Further, the nitriding ratio of the first metal film 221A preferably falls within the same range as that of the oxidation ratio A described above. Incidentally, even when the first metal film 221A of this embodiment is used as the first metal films 121, 221, 321, 431, and 441 of the above-mentioned first, and third to fifth embodiments, and the second metal film 222A of this embodiment is used as the second metal films 122, 222, 322, 432, and 442 of the above-mentioned first, and third to fifth embodiments, the same effect as that of this embodiment can be obtained. Further, in this embodiment, it has been described that the oxidation ratio A or the nitriding ratio A of the first metal film 221A is substantially constant, particularly along the thickness direction throughout the first metal film 221A; however, it is not limited thereto. For example, by setting the oxidation ratio A or the nitriding ratio A as in the above-mentioned first to fifth embodiments, the same effects as those of the above-mentioned first to fifth embodiments can also be obtained.

Electronic Apparatus

Next, an electronic apparatus which includes the electronic device according to the present disclosure will be described.

Figure 36:
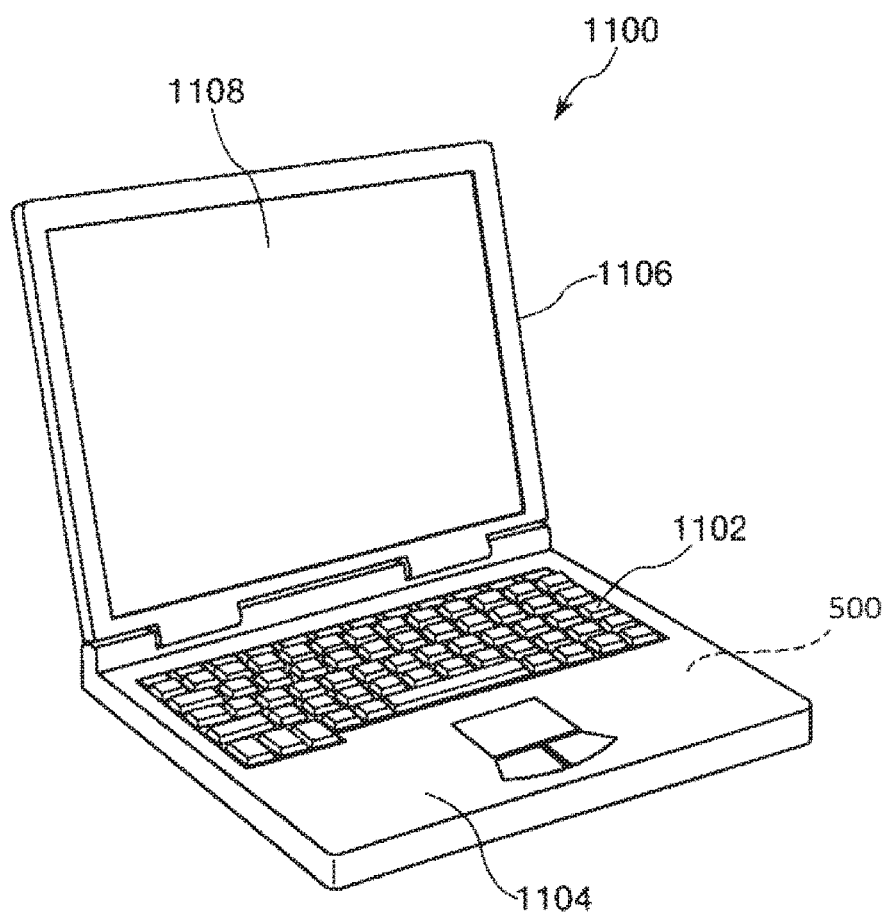
FIG. 36 is a perspective view showing the configuration of a mobile-type (or notebook-type) personal computer to which an electronic apparatus according to the present disclosure is applied.

FIG. 36 is a perspective view showing the configuration of a mobile-type (or notebook-type) personal computer to which an electronic apparatus according to the present disclosure is applied.

In this drawing, a personal computer 1100 is configured to include a main body 1104 provided with a keyboard 1102 and a display unit 1106 provided with a display portion 1108, and the display unit 1106 is supported rotatably with respect to the main body 1104 through a hinge structure. In such a personal computer 1100, for example, a vibrator 500 to be used as an oscillator is included.

Figure 37:
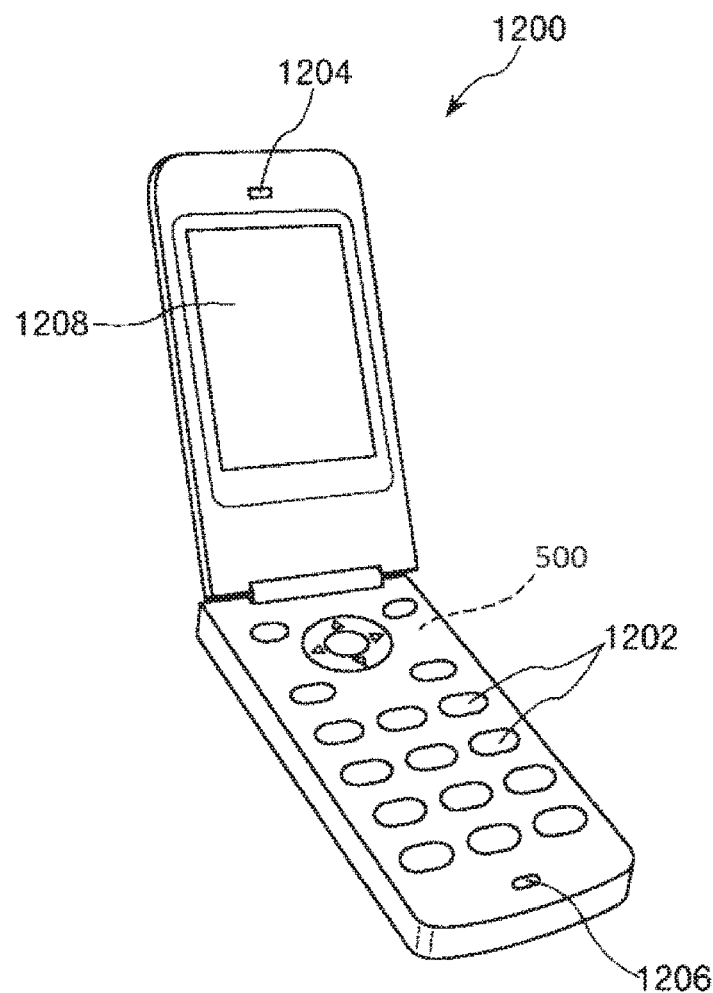
FIG. 37 is a perspective view showing the configuration of a mobile phone (also including a PHS) to which an electronic apparatus according to the present disclosure is applied.

FIG. 37 is a perspective view showing the configuration of a mobile phone (also including a PHS) to which an electronic apparatus according to the present disclosure is applied.

In this drawing, a mobile phone 1200 includes an antenna (not shown), a plurality of operation buttons 1202, an earpiece 1204, and a mouthpiece 1206, and a display portion 1208 is disposed between the operation buttons 1202 and the earpiece 1204. In such a mobile phone 1200, for example, a vibrator 500 to be used as an oscillator is included.

Figure 38:
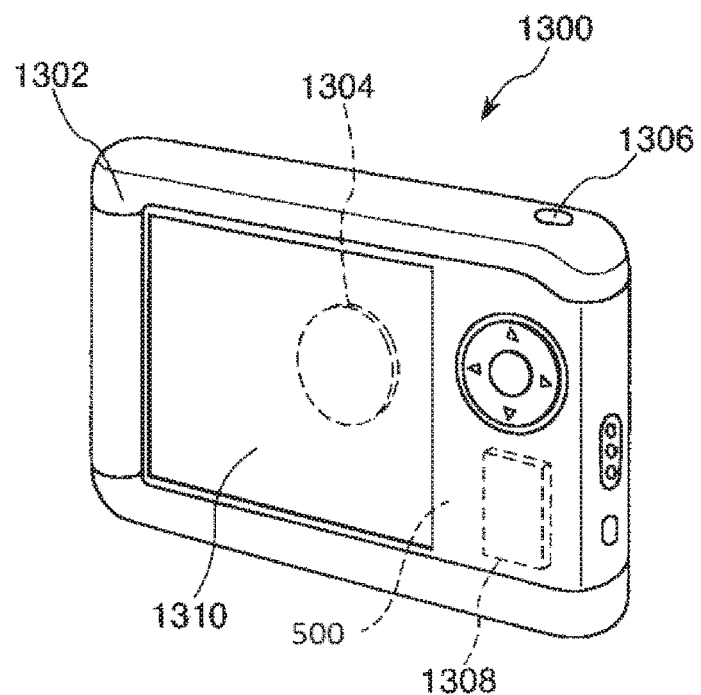
FIG. 38 is a perspective view showing the configuration of a digital camera to which an electronic apparatus according to the present disclosure is applied.

FIG. 38 is a perspective view showing the configuration of a digital camera to which an electronic apparatus according to the present disclosure is applied.

In this drawing, a display portion 1310 is provided on the back surface of a case (body) 1302 in the digital camera 1300 and is configured to perform display based on the imaging signal of the CCD. The display portion 1310 functions as a viewfinder that displays a subject as an electronic image. In addition, alight receiving unit 1304 including an optical lens (imaging optical system), a CCD, and the like is provided on the front side (back side in the drawing) of the case 1302. When a photographer checks a subject image displayed on the display portion 1310 and presses a shutter button 1306, the imaging signal of the CCD at that time point is transferred to and is stored in a memory 1308. In such a digital camera 1300, for example, a vibrator 500 to be used as an oscillator is included.

Such an electronic apparatus includes the vibrator 500, and therefore has excellent reliability.

In addition, as another example of the electronic apparatus, an oscillator 600 as a modification of the above-mentioned fifth embodiment is used as a reference signal source, a voltage-controlled oscillator (VCO), or the like, and for example, a device for a mobile terminal base station that performs communication with a terminal by wired or wireless connections or a transmission device that functions as a local area network apparatus or the like can be exemplified. By applying, for example, the vibrator element 200 or 300 of each embodiment described above, the electronic device 400 of the embodiment described above, the vibrator 500 of the embodiment described above, or the oscillator 600 as a modification of the embodiment described above, a stable frequency signal is output from the vibrator element 200 or 300, the electronic device 400, the vibrator 500, or the oscillator 600 as a clock source to be supplied to a transmission device, and therefore, the electronic apparatus of this embodiment can also be applied to a transmission apparatus which is required to have high performance and high reliability and can be utilized in, for example, a communication base station or the like.

The electronic apparatus according to the present disclosure can be applied not only to the personal computer shown in FIG. 36, the mobile phone shown in FIG. 37, and the digital camera shown in FIG. 38, but also, for example, to a smartphone, a tablet terminal, a timepiece (including a smart watch), an ink jet type discharge apparatus (for example, an ink jet printer), a laptop-type personal computer, a storage area network apparatus such as a router or a switch, a local area network apparatus, an apparatus for a mobile terminal base station, a television, a wearable terminal such as an HMD (head mounted display), a video camera, a video recorder, a car navigation device, a real-time clock device, a pager, an electronic organizer (including a communication function), an electronic dictionary, an electronic calculator, an electronic gaming machine, a word processor, a workstation, a videophone, a security television monitor, electronic binoculars, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish finder, various measurement apparatuses such as a gas meter, a water meter, and an electricity meter (smart meter) having a communication function by wired or wireless connections and capable of transmitting various data, meters and gauges (for example, meters and gauges for vehicles, aircrafts, and ships), a flight simulator, a motion tracer, a motion tracker, a motion controller, a pedestrian dead reckoning (PDR) apparatus, and the like.

Moving Object

Next, a car to which a moving object according to the present disclosure is applied will be described.

Figure 39:
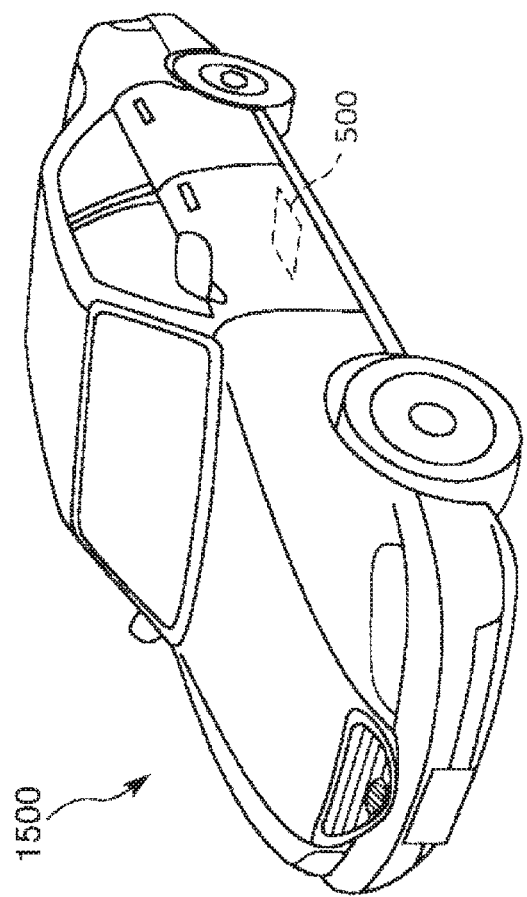
FIG. 39 is a perspective view showing a car to which a moving object according to the present disclosure is applied.

FIG. 39 is a perspective view showing a car to which a moving object according to the present disclosure is applied.

As shown in FIG. 39, in a car 1500, for example, a vibrator 500 to be used as an oscillator is included. The vibrator 500 can be widely applied to, for example, an electronic control unit (ECU), such as a keyless entry, an immobilizer, a car navigation system, a car air conditioner, an anti-lock brake system (ABS), an airbag, a tire pressure monitoring system (TPMS), an engine control, a battery monitor for a hybrid car or an electrical car, and a car body posture control system. In this manner, by including the vibrator 500 in the car 1500, the car 1500 having high reliability is obtained.

Hereinabove, the electronic device, the method for producing an electronic device, the electronic apparatus, and the moving object according to the present disclosure have been described with reference to the embodiments shown in the drawings; however, the present disclosure is not limited thereto, and the configuration of each portion can be replaced with an arbitrary configuration having the same function. Further, in the present disclosure, another arbitrary component may be added to the above-mentioned embodiments, and also the embodiments may be appropriately combined with each other.

The entire disclosure of Japanese Patent Application No. 2015-076942 filed Apr. 3, 2015 and Japanese Patent Application No. 2015-247799 filed on Dec. 18, 2015 are expressly incorporated by reference herein.

What is claimed is:

1. An electronic device, comprising:
a base material having a first surface;
a first metal film disposed on the first surface and containing nitrogen and chromium; and
a second metal film disposed on a surface of the first metal film on the opposite side to the first surface and containing gold, wherein:
the first metal film includes a region in which the number of nitrogen atoms in the first metal film is between 20% to 100% of the number of chromium atoms.

2. The electronic device according to claim 1, wherein the first metal film includes a region in which the number of nitrogen atoms in the first metal film is between 20% to 50% of the number of chromium atoms.

3. The electronic device according to claim 1, wherein the first metal film includes a region in which the number of nitrogen atoms in the first metal film is between 40% to 100% of the number of chromium atoms.

4. The electronic device according to claim 1, wherein the first metal film includes a region in which the number of nitrogen atoms in the first metal film is between 40% to 50% of the number of chromium atoms.

5. The electronic device according to claim 1, wherein the base material contains at least one of quartz crystal, glass, and silicon.

6. The electronic device according to claim 1 further comprising:
a piezoelectric substrate;
an excitation electrode disposed on the piezoelectric substrate; and
a connection electrode disposed on the piezoelectric substrate and electrically connected to the excitation electrode, wherein
the base material is the piezoelectric substrate, and
at least one of the excitation electrode and the connection electrode includes the first metal film and the second metal film.

7. An electronic apparatus comprising the electronic device according to claim 1.

8. A moving object comprising the electronic device according to claim 1.

9. An electronic device, comprising:
a base material having a first surface;
a first metal film disposed on the first surface and containing nitrogen and chromium; and
a second metal film disposed on a surface of the first metal film on the opposite side to the first surface and containing gold, wherein:
the first metal film includes a first region located on the base material side, a second region located on the second metal film side, and a third region interposed between the first region and the second region, and
the third region includes a region in which the distribution of nitrogen atoms is larger than in the first region and in the second region.

10. The electronic device according to claim 9, wherein the first metal film includes a region in which the number of nitrogen atoms in the first metal film is between 20% to 100% of the number of chromium atoms.

11. The electronic device according to claim 9, wherein the first metal film includes a region in which the number of nitrogen atoms in the first metal film is between 20% to 50% of the number of chromium atoms.

12. The electronic device according to claim 9, wherein the first metal film includes a region in which the number of nitrogen atoms in the first metal film is between 40% to 100% of the number of chromium atoms.

13. The electronic device according to claim 9, wherein the first metal film includes a region in which the number of nitrogen atoms in the first metal film is between 40% to 50% of the number of chromium atoms.

14. The electronic device according to claim 9, wherein the base material contains at least one of quartz crystal, glass, and silicon.

15. The electronic device according to claim 9 further comprising:
a piezoelectric substrate;
an excitation electrode disposed on the piezoelectric substrate; and
a connection electrode disposed on the piezoelectric substrate and electrically connected to the excitation electrode, wherein
the base material is the piezoelectric substrate, and
at least one of the excitation electrode and the connection electrode includes the first metal film and the second metal film.

16. An electronic apparatus comprising the electronic device according to claim 9.

* * * * *